(12) United States Patent
Akahori et al.

(10) Patent No.: US 7,651,914 B2
(45) Date of Patent: Jan. 26, 2010

(54) MANUFACTURING METHOD OF A NONVOLATILE SEMICONDUCTOR MEMORY DEVICE

(75) Inventors: Hiroshi Akahori, Yokohama (JP);
Wakako Takeuchi, Yokohama (JP);
Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/176,559

(22) Filed: Jul. 21, 2008

(65) Prior Publication Data
US 2009/0011586 A1 Jan. 8, 2009

Related U.S. Application Data

(62) Division of application No. 11/870,793, filed on Oct. 11, 2007, now Pat. No. 7,414,285.

(30) Foreign Application Priority Data
Oct. 13, 2006 (JP) ............................. 2006-280410

(51) Int. Cl.
*H01L 21/336* (2006.01)
*H01L 21/3205* (2006.01)
*H01L 21/28* (2006.01)

(52) U.S. Cl. ...................... 438/257; 438/261; 438/264; 438/267; 438/595; 257/E21.179

(58) Field of Classification Search ................. 438/257, 438/261, 264, 267, 595; 257/E21.179
See application file for complete search history.

(56) References Cited

U.S. PATENT DOCUMENTS 5,304,829 A * 4/1994 Mori et al. .................. 257/324
5,661,056 A 8/1997 Takeuchi (Continued)

FOREIGN PATENT DOCUMENTS

| JP | 07-249697 | 9/1995 |
| KR | 10-2006-0073046 | 6/2006 |

OTHER PUBLICATIONS

Aritome et al., "Reliability Issues of Flash Memory Cells," Proceedings of the IEEE, vol. 81, No. 5, pp. 776-788, (May 1993).

(Continued)

*Primary Examiner*—Luan C Thai
(74) *Attorney, Agent, or Firm*—Finnegan, Henderson, Farabow, Garrett Dunner, L.L.P.

(57) ABSTRACT

A manufacturing method of a nonvolatile semiconductor memory device including: providing a first insulating film and a silicon film on a semiconductor substrate; providing a fifth insulating film containing silicon and oxygen on the silicon film; providing a second insulating film containing silicon and nitrogen on the fifth insulating film; providing a third insulating film on the second insulating film, the third insulating film is composed of a single-layer insulating film containing oxygen or multiple-layer stacked insulating film at least whose films on a top layer and a bottom layer contain oxygen, and relative dielectric constant of the single-layer insulating film and the stacked insulating film being larger than relative dielectric constant of a silicon oxide film; providing a fourth insulating film containing silicon and nitrogen on the third insulating film; and providing a control gate above the fourth insulating film.

16 Claims, 18 Drawing Sheets

U.S. PATENT DOCUMENTS

| | | | | |
|---|---|---|---|---|
| 5,907,183 A | * | 5/1999 | Takeuchi | 257/640 |
| 5,981,404 A | * | 11/1999 | Sheng et al. | 438/791 |
| 6,187,633 B1 | * | 2/2001 | Dong et al. | 438/261 |
| 7,101,749 B2 | | 9/2006 | Mori | |
| 2003/0205753 A1 | * | 11/2003 | Mori | 257/314 |
| 2006/0141711 A1 | * | 6/2006 | Dong | 438/264 |
| 2006/0240619 A1 | | 10/2006 | Ozawa et al. | |

OTHER PUBLICATIONS

Choi et al., "Highly Manufacturable 1 Gb NAND Flash Using 0.12 μm Process Technology," IEDM Technical Digest, pp. 25-28, (2001).

Notification for Filing Opinion mailed Aug. 27, 2008, for co-pending Korean App. No. 10-2007-103125 and English translation thereof.

* cited by examiner

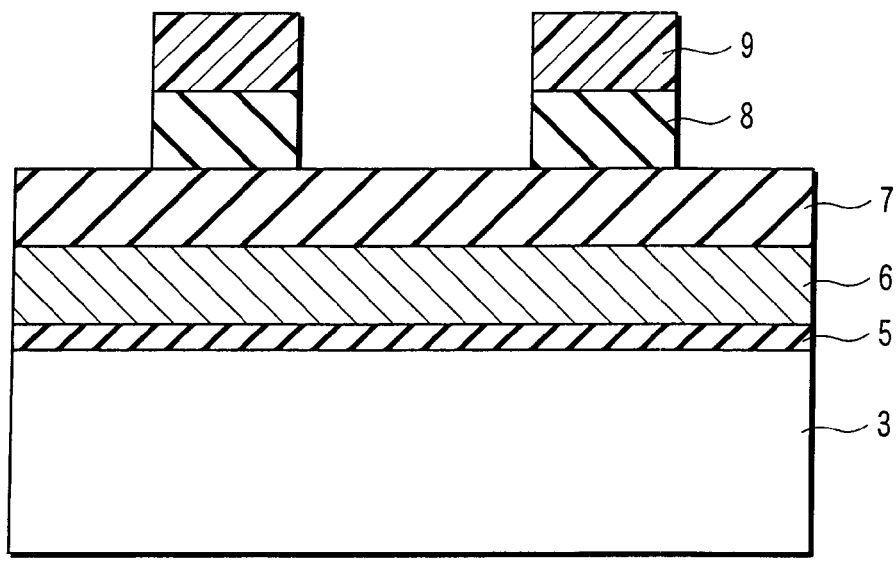
F I G. 4A
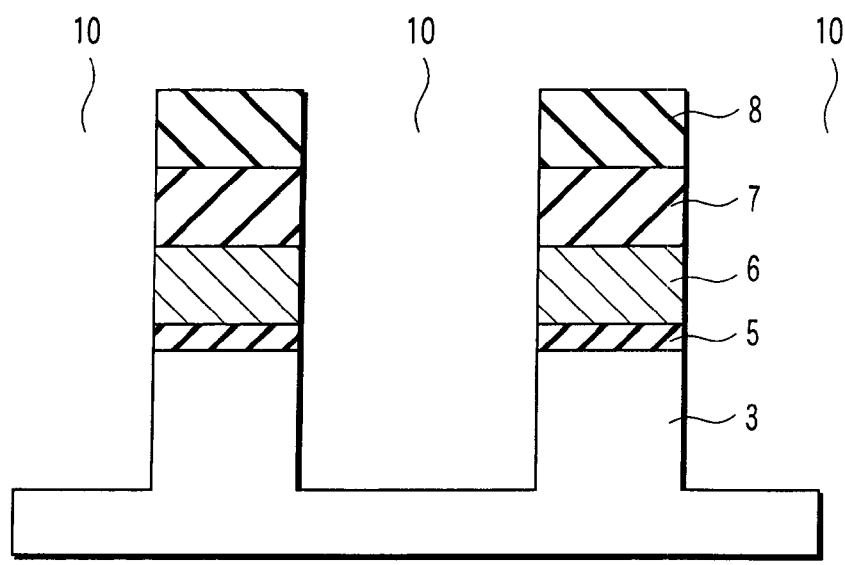
F I G. 4B

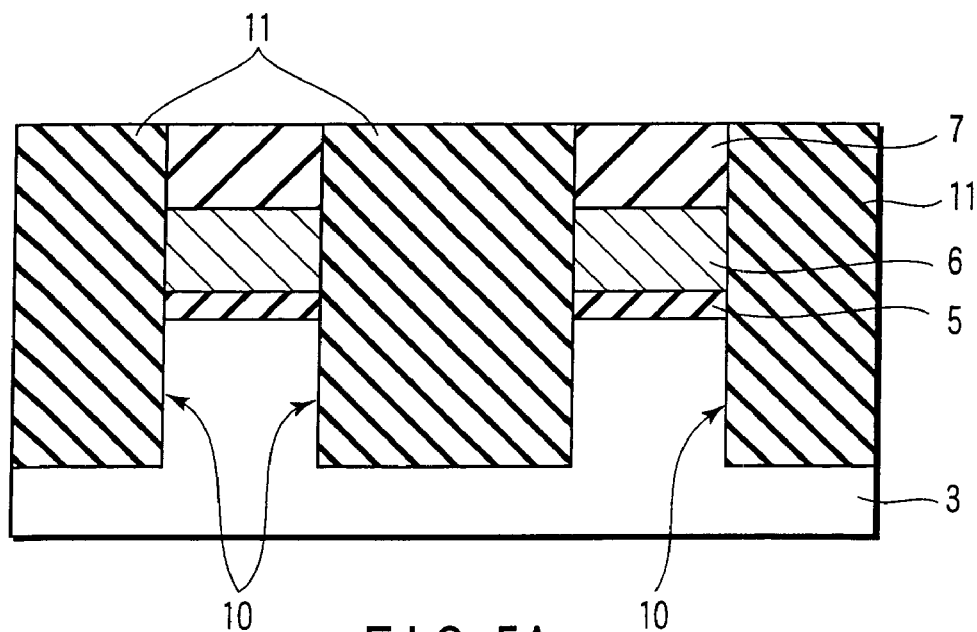
F I G. 5A
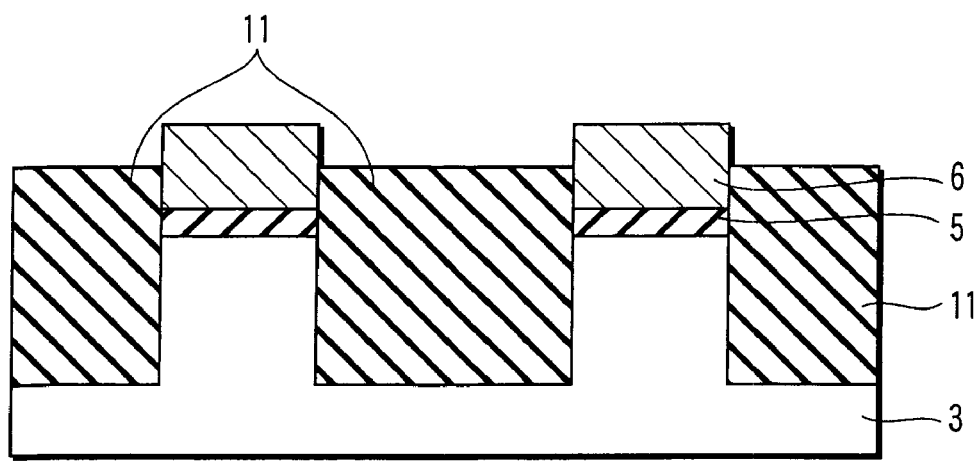
F I G. 5B

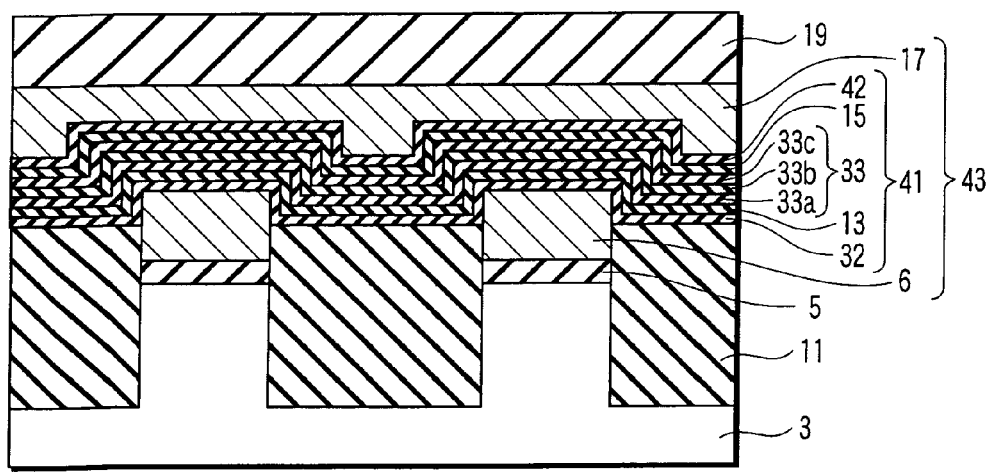
F I G. 13A
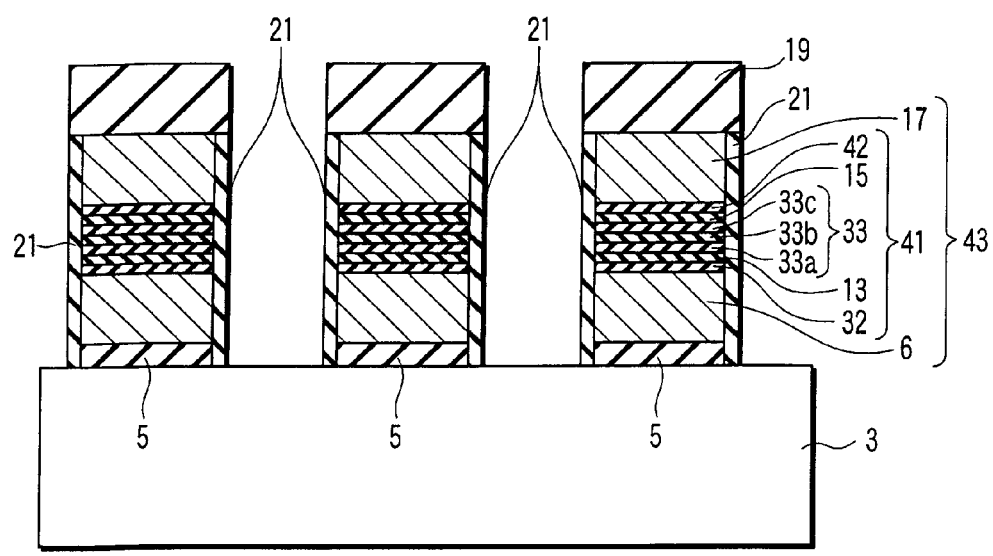
F I G. 13B

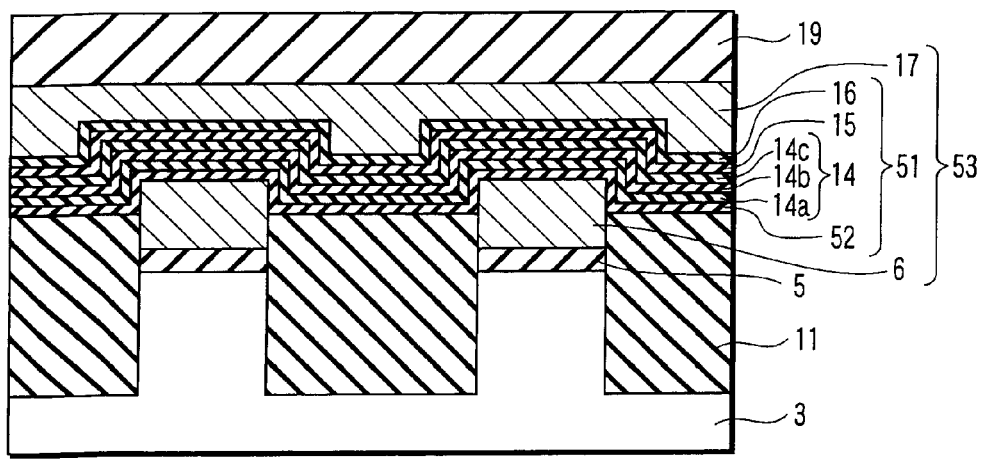
F I G. 15A
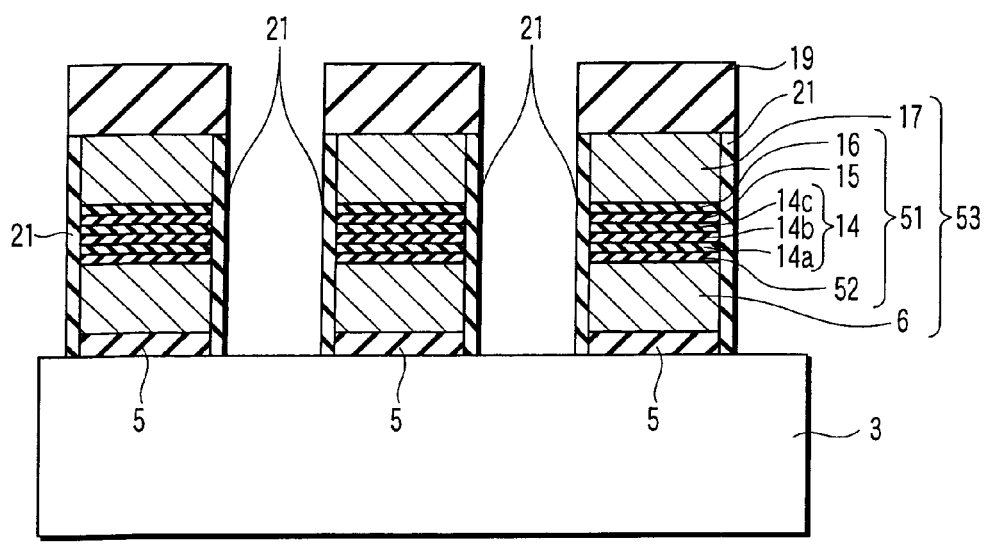
F I G. 15B

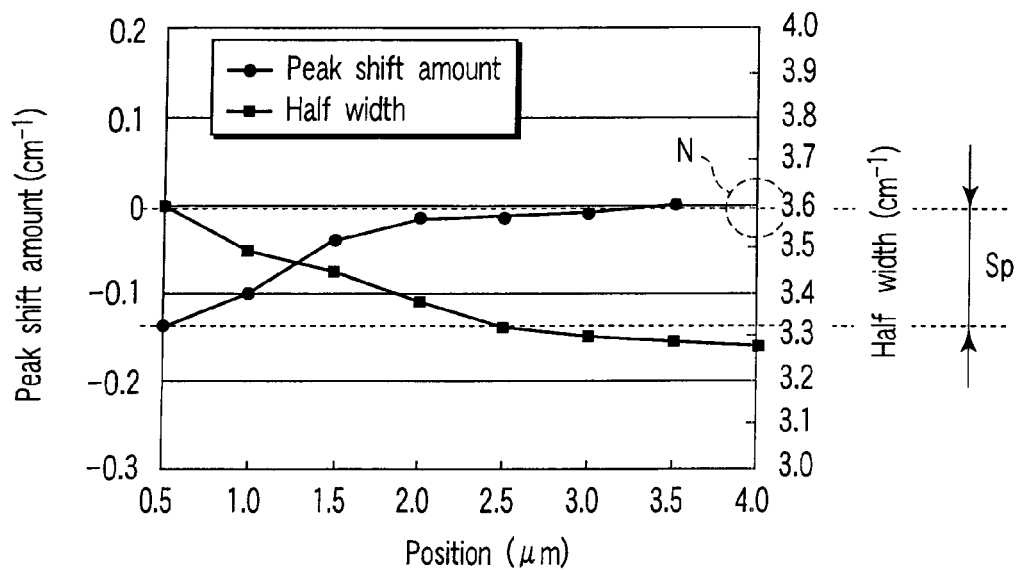
F I G. 17
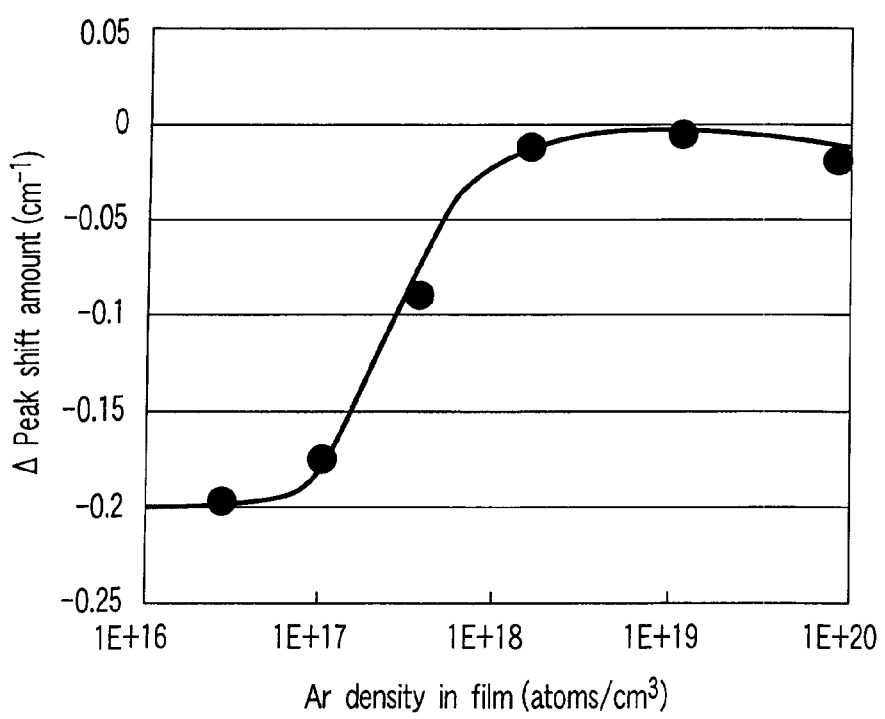
F I G. 18

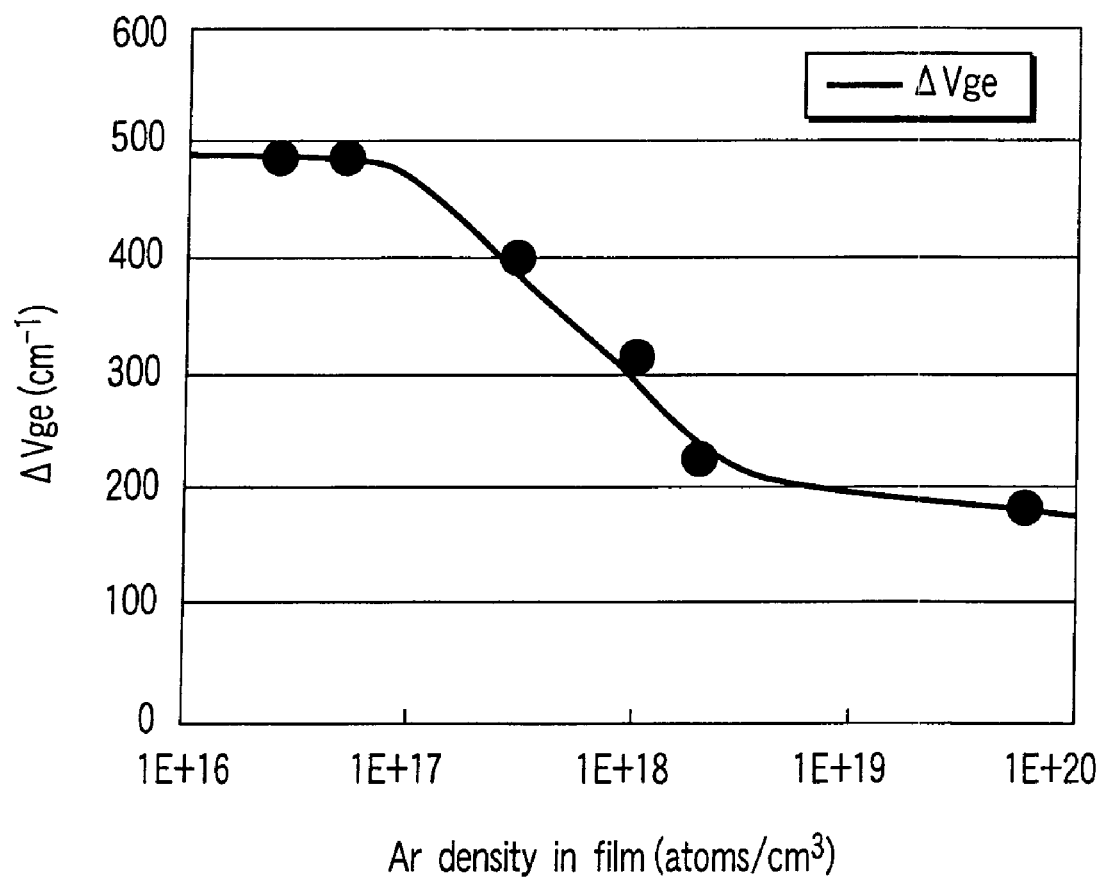
F I G. 19

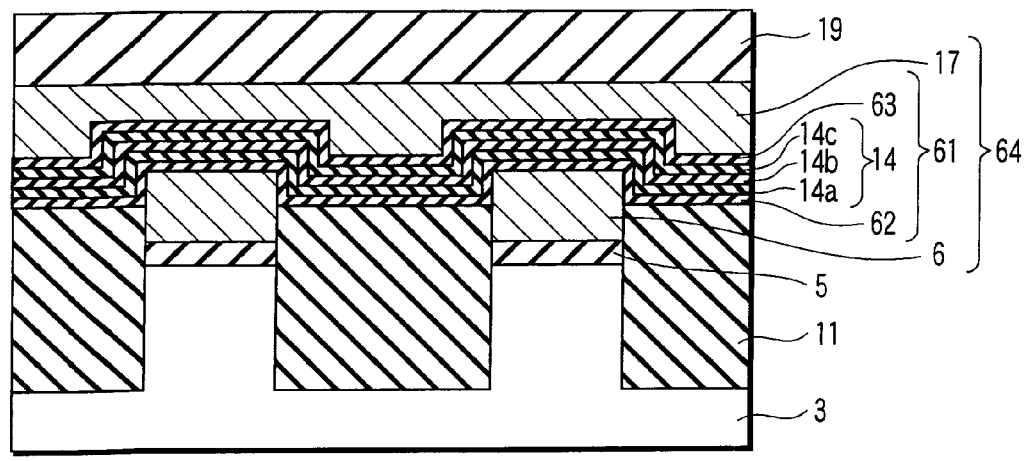
F I G. 20A
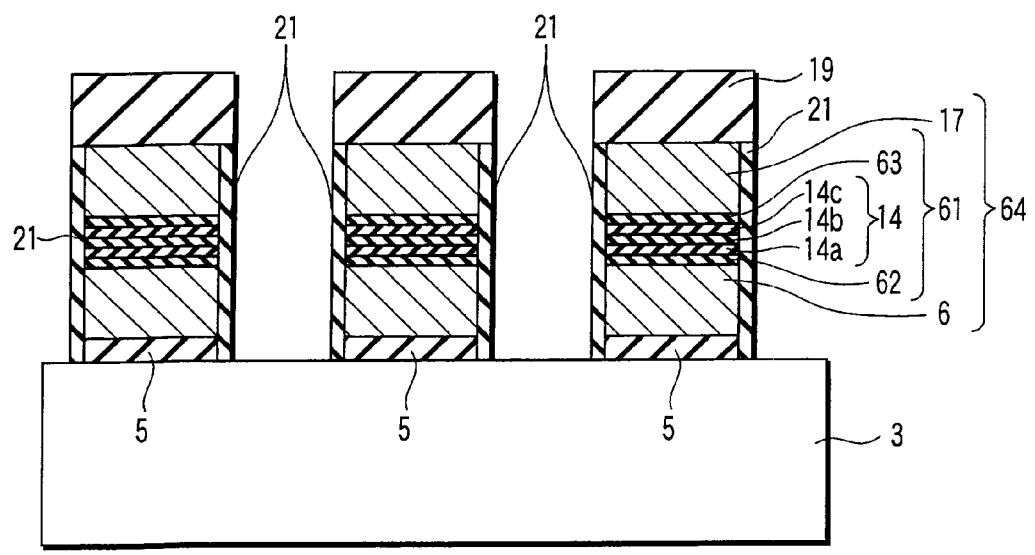
F I G. 20B

MANUFACTURING METHOD OF A NONVOLATILE SEMICONDUCTOR MEMORY DEVICE

CROSS-REFERENCE TO RELATED APPLICATIONS

This is a divisional application of application Ser. No. 11/870,793, filed Oct. 11, 2007 now U.S. Pat. No. 7,414,285, which is based upon and claims the benefit of priority from prior Japanese Patent Application No. 2006-280410, filed Oct. 13, 2006, the entire contents of both of which are incorporated herein by reference.

BACKGROUND OF THE INVENTION

1. Field of the Invention

The present invention relates to a rewritable nonvolatile semiconductor memory device, and particularly relates to a floating-gate nonvolatile semiconductor memory device.

2. Description of the Related Art

Semiconductor devices include rewritable semiconductor memory devices (nonvolatile memories) which are called floating-gate nonvolatile semiconductor memory devices. General floating-gate nonvolatile semiconductor memory devices have memory transistors which are constituted so that a tunnel gate insulating film, a floating gate, an inter-electrode insulating film and a control gate are sequentially stacked to cover a channel area between a source area and a drain area formed on a surface layer of a semiconductor substrate.

In recent years, miniaturization and high-integration of the semiconductor devices are noticeable. In the floating-gate nonvolatile semiconductor memory devices, as scaling down of cell structure proceeds, influence of so-called bird's beak formed at the edge of capacitor insulating films increases. When the bird's beak is formed on the inter-electrode insulating film, a capacitance of an inter-electrode insulating composed of the floating gate, the inter-electrode insulating film and the control gate is reduced. When the capacitance is reduced, a coupling ratio is also reduced so that an electric field applied to the inter-electrode insulating film increases. As a result, reliability and performance of the floating-gate nonvolatile semiconductor memory device as well as reliability and performance of the memory transistor deteriorate.

Such a problem is not much noticeable because even if a bird's beak is formed on a terminal of inter-electrode insulating film, a percentage of the area of the bird's beak with respect to the area of the whole inter-electrode insulating film is small in a generation where a gate width is comparatively large. However, when floating-gate nonvolatile semiconductor memory devices are further miniaturized in the future, the percentage of the area of a bird's beak portion with respect to the area of the whole inter-electrode insulating film increases. For this reason, such a problem is unignorable. Therefore, in the case where the floating-gate nonvolatile semiconductor memory devices are further miniaturized in the future, it is an important problem to prevent a bird's beak. From another point of view, it is an important problem to control an amount of the bird's beak within an allowable range.

Normally, the bird's beak of the inter-electrode insulating film is formed when a sidewall of the memory transistor is subject to an oxidizing process. The oxidizing process to be given to the transistor sidewall is executed in order to recover from plasma damage generated in a reactive ion etching process to form a gate of the memory transistor. Oxidizing species for oxidizing the transistor sidewall diffuse to the inside of the inter-electrode insulating film from the insulating film edges. The bird's beak of the inter-electrode insulating film is formed by oxidation of surfaces of the floating gate and the control gate made of polycrystal silicon.

A method of controlling a bird's beak generated due to such a mechanism includes the following methods. Jpn. Pat. Appln. KOKAI Publication No. 7-249697 proposes a technique of a NONON film structure such that when an inter-electrode insulating film is formed into an ONO film structure composed of three layers: an oxide film, a nitride film and an oxide film, SiN films are provided on both upper and lower faces of the ONO film. Similarly, U.S. Pat. No. 5,661,056, U.S. Pat. No. 5,907,183 and the like propose that a SiN film is inserted between an inter-electrode insulating film and a floating gate electrode or a control gate.

The method of forming the SiN film between an inter-electrode insulating film whose top layer and bottom layer are made of oxide films and upper and lower polycrystal silicon electrodes includes the following methods, for example. In one method, a polycrystal silicon electrode is subject to a thermal nitriding process in an $NH_3$ atmosphere so that a SiN film is deposited on an interface between a floating gate electrode as a lower electrode and the inter-electrode insulating film. In another method, a SiN film is deposited on a polycrystal silicon electrode by a CVD method. In still another method, a SiN film is deposited on an oxide film as the top layer of an inter-electrode insulating film on an interface between a control gate electrode as an upper electrode and the inter-layer insulating film. As a result of examinations by the inventors of the present invention, however, when the SiN film is simply inserted between the inter-electrode insulating film and the floating gate electrode or the control gate electrode, a bird's peak of the inter-electrode insulating film can be prevented, but an operation of a floating-gate nonvolatile semiconductor memory device such as charge retention property is affected.

BRIEF SUMMARY OF THE INVENTION

According to an aspect of the invention, there is provided a manufacturing method of a nonvolatile semiconductor memory device comprising: providing a first insulating film on a surface of a semiconductor substrate; providing a silicon film to be a charge accumulation layer on the first insulating film; providing a fifth insulating film containing silicon and oxygen on the silicon film by performing a surface treatment using a solution having hydrogen peroxide added therein or a solution having ozone added therein to the silicon film; providing a second insulating film containing silicon and nitrogen on the fifth insulating film; providing a third insulating film on the second insulating film, the third insulating film is composed of a single-layer insulating film containing oxygen or multiple-layer stacked insulating film at least whose films on a top layer and a bottom layer contain oxygen, and relative dielectric constant of the single-layer insulating film and the stacked insulating film being larger than relative dielectric constant of a silicon oxide film; providing a fourth insulating film containing silicon and nitrogen on the third insulating film; and providing a control gate above the fourth insulating film.

According to another aspect of the invention, there is provided a manufacturing method of a nonvolatile semiconductor memory device comprising: providing a first insulating film on a surface of a semiconductor substrate; providing a silicon film to be a charge accumulation layer on the first insulating film; providing a second insulating film containing silicon and nitrogen on the silicon film by applying a nitriding treatment directly to a surface of the silicon film using nitrogen radical generated from a plasma of inactive gas and nitrogen; providing a third insulating film on the second insulating film, the third insulating film is composed of a single-layer insulating film containing oxygen or multiple-layer stacked insulating film at least whose films on a top layer and a bottom layer contain oxygen, and relative dielectric constant of the single-layer insulating film and the stacked insulating film being larger than relative dielectric constant of a silicon oxide film; providing a fourth insulating film containing silicon and nitrogen on the third insulating film; and providing a fifth insulating film containing silicon and oxygen on the fourth insulating film; and providing a control gate on the fifth insulating film.

According to yet another aspect of the invention, there is provided a manufacturing method of a nonvolatile semiconductor memory device comprising: providing a first insulating film on a surface of a semiconductor substrate; providing a silicon film to be a charge accumulation layer on the first insulating film; providing a second insulating film containing silicon and nitrogen on the silicon film and containing hydrogen element in the second insulating film; providing a third insulating film on the second insulating film, the third insulating film is composed of a single-layer insulating film containing oxygen or multiple-layer stacked insulating film at least whose films on a top layer and a bottom layer contain oxygen, and relative dielectric constant of the single-layer insulating film and the stacked insulating film being larger than relative dielectric constant of a silicon oxide film; providing a fourth insulating film containing silicon and nitrogen on the third insulating film and containing hydrogen element in the fourth insulating film; and providing a control gate on the fourth insulating film.

BRIEF DESCRIPTION OF THE SEVERAL VIEWS OF THE DRAWING

FIGS. 4A and 4B are sectional views taken along the break line A-A' in FIG. 1 illustrating the process of manufacturing the nonvolatile semiconductor memory device shown in FIG. 1;

FIGS. 5A and 5B are sectional views taken along the break line A-A' in FIG. 1 illustrating the process of manufacturing the nonvolatile semiconductor memory device shown in FIG. 1;

FIGS. 13A and 13B are sectional views illustrating a process of manufacturing a nonvolatile semiconductor memory device according to a third embodiment;

FIGS. 15A and 15B are sectional views illustrating a process of manufacturing a nonvolatile semiconductor memory device according to a fourth embodiment;

FIG. 17 is a graph illustrating a stress evaluation example of a SiN film by means of Raman measurement;

FIG. 18 is a graph illustrating a relationship between Ar density in a silicon nitride film on a bottom layer of the inter-electrode insulating film of the nonvolatile semiconductor memory device shown in FIG. 16 and a peak shift amount by means of the Raman measurement;

FIG. 19 is a graph illustrating a relationship between the Ar density in the silicon nitride film on the bottom layer of the inter-electrode insulating film of the nonvolatile semiconductor memory device shown in FIG. 16 and a voltage shift amount at the time of constant current TDDB measurement;

FIGS. 20A and 20B are sectional views illustrating a process of manufacturing a nonvolatile semiconductor memory device according to a fifth embodiment.

DETAILED DESCRIPTION OF THE INVENTION

Embodiments of the present invention will be described below with reference to the drawings.

First Embodiment

Figure 1:
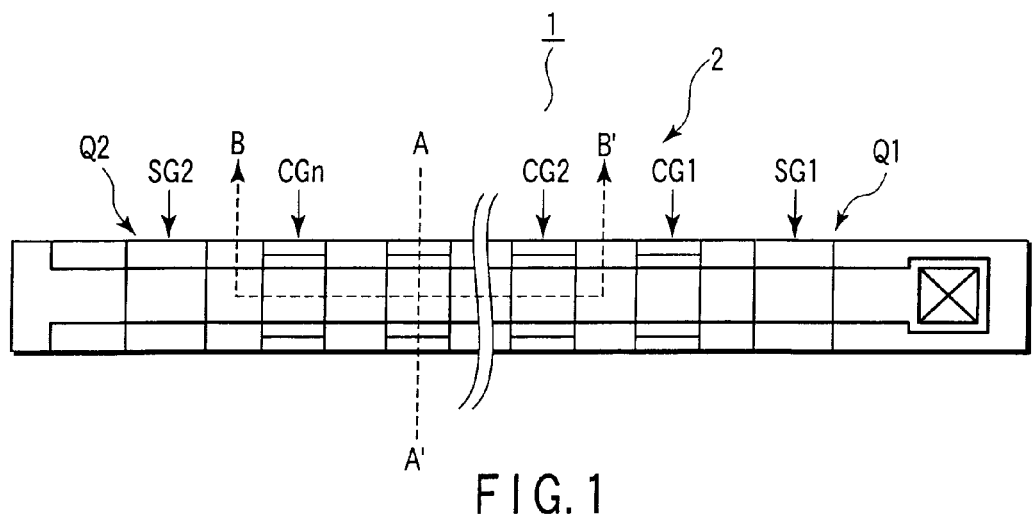
FIG. 1 is a plan view simply illustrating a structure of a memory cell array portion of a nonvolatile semiconductor memory device according to a first embodiment.
Figure 2:
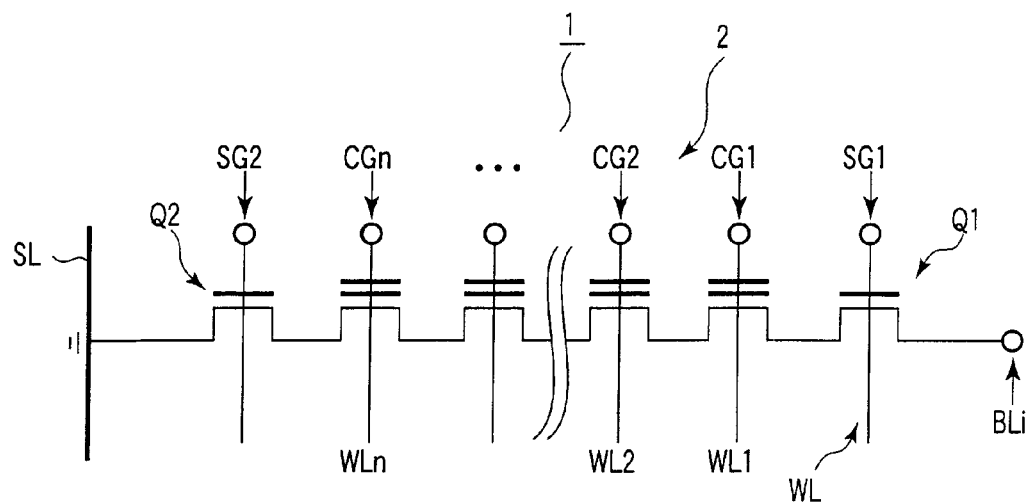
FIG. 2 is a diagram simply illustrating a circuit configuration of the memory cell array portion of the nonvolatile semiconductor memory device shown in FIG. 1.
Figure 10:
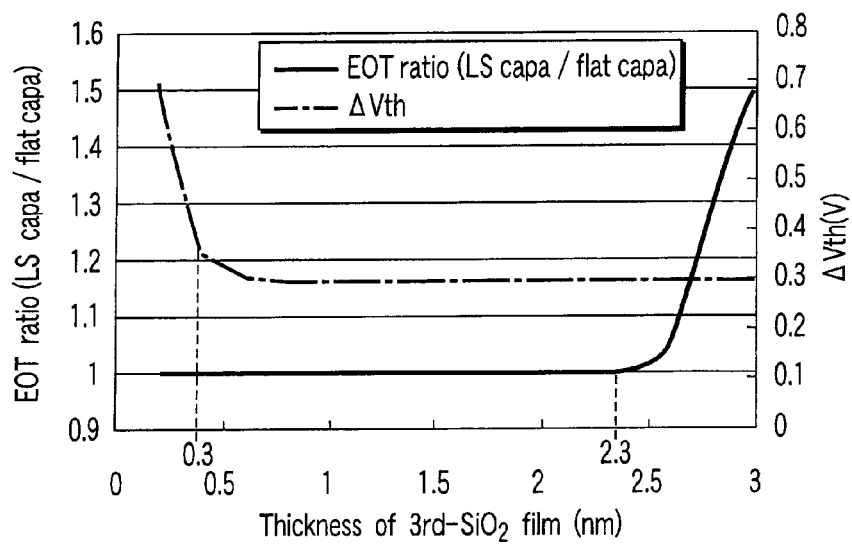
FIG. 10 is a graph illustrating a bird's beak generating amount and a dependence property of the charge retention property with respect to a thickness of a silicon oxide film on the top layer of an inter-electrode insulating film of the nonvolatile semiconductor memory device shown in FIG. 1.

A first embodiment of the present invention will be described below with reference to FIGS. 1 to 10. FIG. 1 is a plan view simply illustrating a structure of a memory cell array portion of a nonvolatile semiconductor memory device according to the first embodiment. FIG. 2 is a diagram simply illustrating a circuit configuration of the memory cell array portion of the nonvolatile semiconductor memory device shown in FIG. 1. FIGS. 3 to 9 are sectional views illustrating a process of manufacturing the nonvolatile semiconductor memory device shown in FIG. 1. FIG. 10 is a graph illustrating a bird's beak generating amount and a dependence property of a charge retention property with respect to a thickness of a silicon oxide film on a top layer of an inter-electrode insulating film of the nonvolatile semiconductor memory device shown in FIG. 1.

Prior to the description of the first embodiment, a problem which easily arises in the rewritable nonvolatile semiconductor memory device of general floating gate type will be described.

In the general floating-gate rewritable nonvolatile semiconductor memory device, a leakage current is applied to an inter-electrode insulating film at a program operation, namely, a repeating process of writing and erasing. At this time, electric charges are occasionally trapped by the inter-electrode insulating film.

When a SiN film to be a part of the inter-electrode insulating film is formed on a film containing silicon by a normal step in, for example, an ammonium ($NH_3$) atmosphere, many interface levels are formed on interfaces of the respective films. At the time of operating the floating-gate nonvolatile semiconductor memory device, two phenomena are seen, i.e., a phenomenon of electron trap to shallow level in the many interface levels, and a phenomenon of electron detrap from the shallow level. The phenomenon of electron trap and detrap become major factors in causing the electron retention property of the nonvolatile semiconductor memory device to deteriorate. Similarly, it is found that many trap levels are present also in a CVD-SiN film. One reason why many trap levels are present in the CVD-SiN film is that many impurities such as hydrogen are present in the CVD-SiN film. The phenomenon of electron trap and detrap in the CVD-SiN film become major factors in causing the electron retention property of the nonvolatile semiconductor memory device to deteriorate noticeably.

Particularly when a silicon nitride film is inserted between the inter-electrode insulating film and a control gate, electrons are easily trapped by the silicon nitride film, and electrons are easily detrapped from the silicon nitride film during the electron retaining operation. Since a film stress is great in the SiN film, stress is easily concentrated near its interface. It is estimated that the concentration of stress near the interface becomes one factor in increasing a trap site in the SiN film. Such a phenomenon becomes a variation factor of transistor threshold voltage, and thus causes the reliability of a semiconductor memory to deteriorate. As a result, in the first embodiment, a silicon oxide film is formed on an interface between the control gate and the silicon nitride film, so that the formation of a bird's beak in the inter-electrode insulating film is prevented, and bad influences of the electron trap phenomenon and detrap phenomenon are effectively reduced to thereby improve device characteristics.

The electron trap amount in the inter-electrode insulating film is proportional to a leakage current to be applied to the inter-electrode insulating film. In order to improve the reliability of the memory operation, the leakage current should be reduced. The leakage current to be applied to the inter-electrode insulating film induces the reduction in speed of writing and erasing operations, and thus prevents realization of a high-performance memory. The leakage current to be applied to the inter-electrode insulating film greatly influences a distribution width of threshold voltage of cell transistor.

Particularly, a leakage current easily changes according to an interface state between the surface of the floating gate and the inter-electrode insulating film. When the interface state between the surface of the floating gate and the inter-electrode insulating film is not good, a barrier height formed between the floating gate composed of a polycrystal silicon film and the inter-electrode insulating film is reduced, so that the leakage current increases. For example, in the case where the inter-electrode insulating film has a NONON film structure, the interface between the surface of the floating gate and the inter-electrode insulating film is a silicon nitride film. In this case, many levels for increasing the leakage current are present in the silicon nitride film, and thus the leakage characteristic of the inter-electrode insulating film deteriorates.

Thus, in the first embodiment, when the silicon oxide film is formed on the interface between the floating gate and the silicon nitride film, the formation of the bird's beak in the inter-electrode insulating film is prevented, and deterioration of the leakage characteristic of the inter-electrode insulating film is effectively prevented so that the device characteristics are improved. In the first embodiment, when the silicon oxide film is formed on the interface between the control gate and the silicon nitride film and on the interface between the floating gate and the silicon nitride film, formation of the bird's beak in the inter-electrode insulating film is prevented. Further, bad influences of the charge trap phenomenon and detrap phenomenon are reduced, and deterioration of the leakage characteristic of the inter-electrode insulating film is prevented so that the device characteristics are further improved.

In the first embodiment, therefore, the following insulating film is adopted on a center portion of the inter-electrode insulating film of the floating-gate rewritable nonvolatile semiconductor memory device. The insulating film is composed of a single-layer insulating film containing oxygen, or a plural-layer stacked insulating film at least whose top layer and bottom layer contain oxygen. The relative dielectric constant of the single-layer insulating film and the stacked insulating film is larger than the relative dielectric constant of the silicon oxide film. An insulating film containing silicon and nitrogen is provided onto the upper and lower surfaces of the insulating film. A three-layer stacked insulating film having an ONO film structure in which a silicon oxide film is formed on the upper and lower surfaces of a silicon nitride film is used as the insulating film on the center portion of the inter-electrode insulating film. A silicon nitride film is formed on the upper and lower surfaces of the ONO film. That is, in the first embodiment, a main portion of the inter-electrode insulating film has a NONON film structure where the silicon nitride films and the silicon oxide films are stacked alternately into five layers. In the first embodiment, one more silicon oxide film is added to the upper surface of the NONON film, so that the inter-electrode insulating film has a NONONO film structure.

Specifically, in the first embodiment, a silicon oxide film is inserted between the NONON film provided onto the floating gate and the control gate. This allows prevention of the formation of the bird's beak in the inter-electrode insulating film, thereby to improve its electrical properties, reliability, performance and quality. The details will be described below specifically.

A structure of the memory cell array portion of the nonvolatile semiconductor memory device (nonvolatile memory) according to the first embodiment and its circuit configuration will be described with reference to FIGS. 1 and 2. The nonvolatile memory according to the first embodiment is specifically a NAND-type flash memory.

As shown in FIGS. 1 and 2, in the memory cell array portion 2 of the NAND-type flash memory 1 in the first embodiment, a plurality of cell transistors CG1 to CGn for storage composed of n-channel MOSFET having a floating gate and a control gate are connected in series. The cell transistors CG1 to CGn are formed on one well substrate (not shown).

The control gates of the cell transistors CG1 to CGn are connected to a plurality of word lines WL1 to WLn arranged successively in a line direction, respectively. Drains on one terminal in impurity diffusing regions of the cell transistors CG1 to CGn are connected to a plurality of bit lines BLi (i=1, 2, ...) via an NMOS transistor Q1 for selection, respectively. Similarly, sources on the other terminals in the impurity diffusing regions of the cell transistors CG1 to CGn are connected to source lines SL via an NMOS transistor Q2 for selection, respectively. A control gate of the selection transistor Q1 is connected to a selection line SG1. Similarly, a control gate of the selection transistor Q2 is connected to a selection line SG2. Terminals of the word lines WL1 to WLn formed on an element separating film are connected to a pad for connection with a peripheral circuit (not shown) via a metal wiring.

Figure 8:
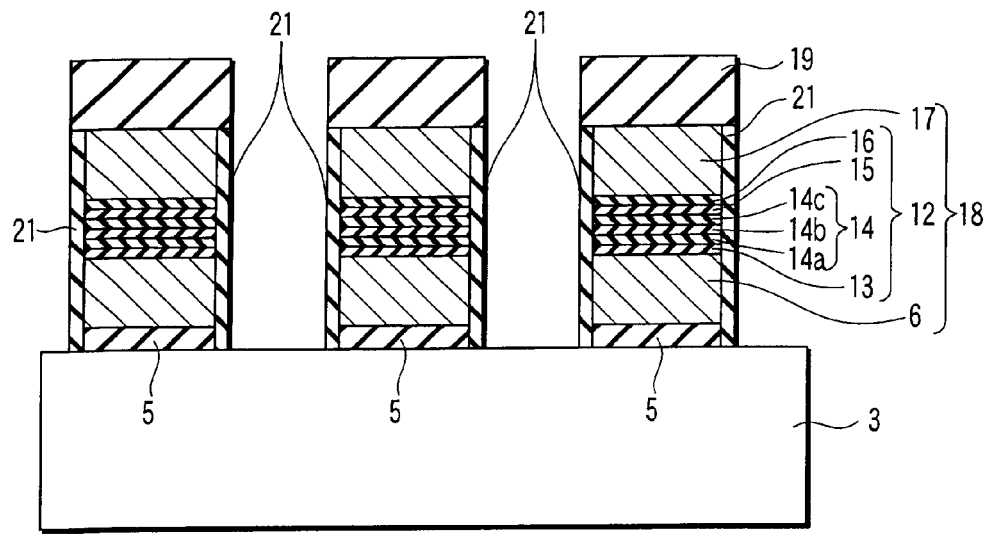
FIG. 8 is a sectional view taken along the break line B-B' in FIG. 1 illustrating the process of manufacturing the nonvolatile semiconductor memory device shown in FIG. 1.
Figure 9:
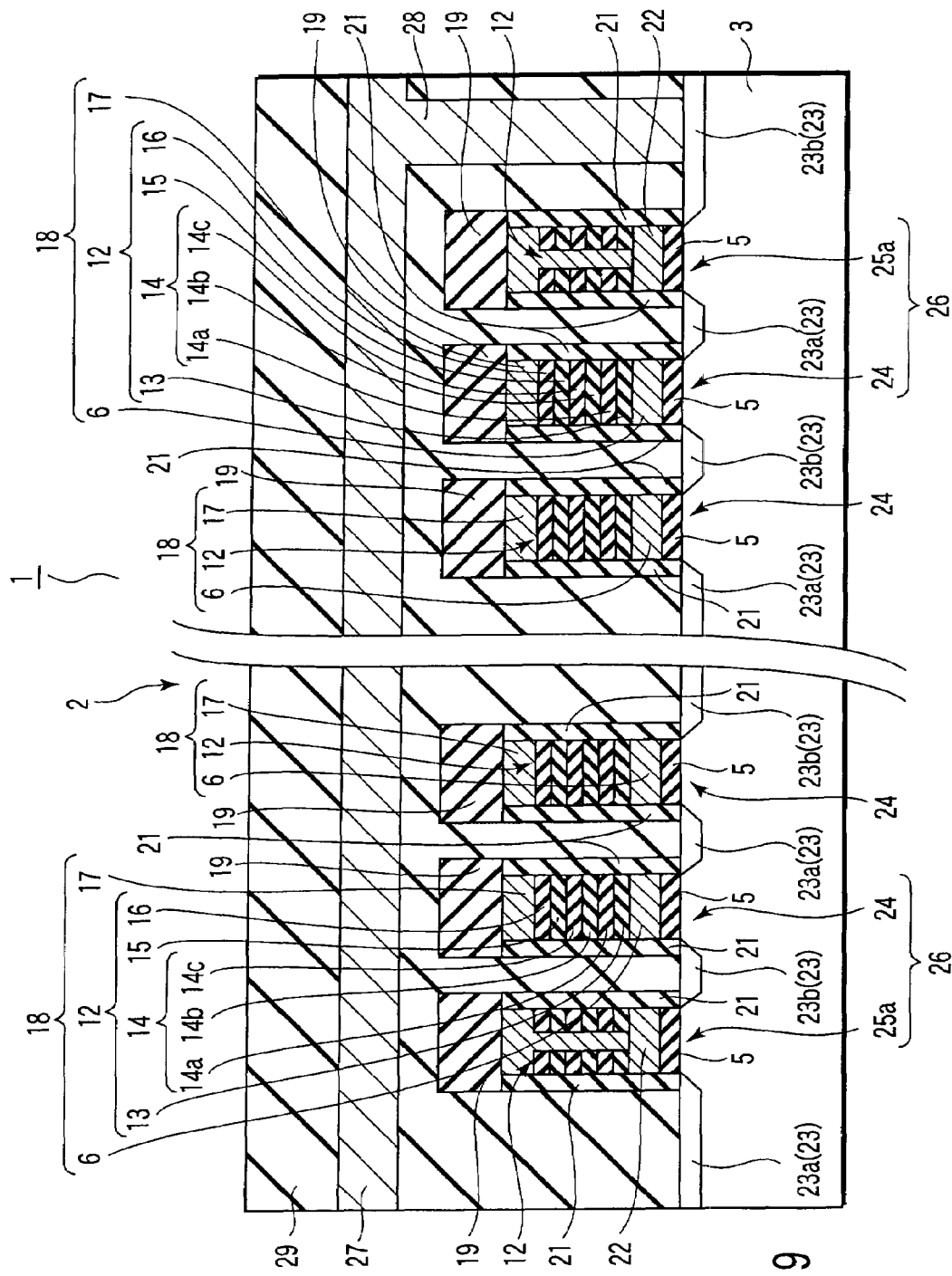
FIG. 9 is a sectional view taken along the break line B-B' in FIG. 1 illustrating the process of manufacturing the nonvolatile semiconductor memory device shown in FIG. 1.

A method of manufacturing the NAND-type flash memory 1 according to the first embodiment will be described below with reference to FIGS. 3 to 9. FIGS. 3A, 3B, 3C, 4A, 4B, 5A, 5B, 6A, 6B and 7A are sectional views taken along a break line A-A' in FIG. 1 and illustrate two adjacent cells. On the contrary, FIGS. 7B, 8 and 9 are sectional views taken along a break line B-B' orthogonal to the break line A-A' in FIG. 1.

Figure 3A:
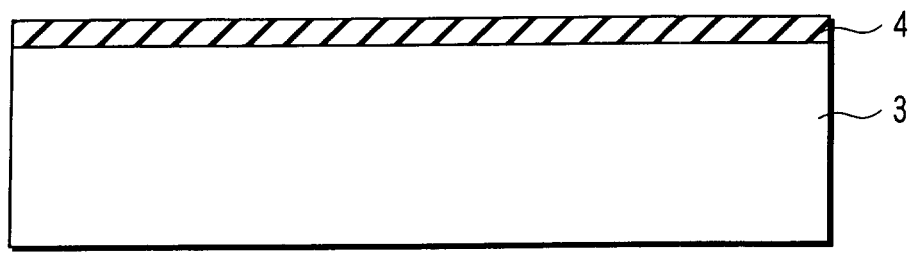
FIGS. 3A to 3C are sectional views taken along a break line A-A' in FIG. 1 illustrating a process of manufacturing the nonvolatile semiconductor memory device shown in FIG. 1.

As shown in FIG. 3A, a silicon oxide ($SiO_2$) film 4 is provided on the surface of a P type silicon substrate 3, for example, by a thermal oxidizing method.

Figure 3B:
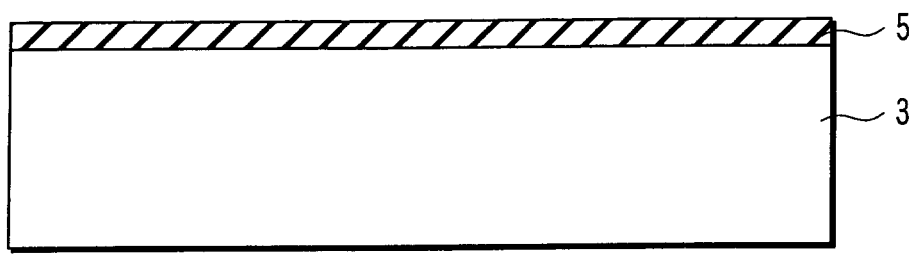

As shown in FIG. 3B, the silicon oxide film 4 is nitrided by using ammonia gas ($NH_3$ gas), so as to be transformed into a silicon oxynitride (SiON) film 5 as a first insulating film. The silicon oxynitride film 5 serves as a first gate insulating film. The silicon oxynitride film 5 is referred to generally as a tunnel oxide film or a tunnel gate insulating film.

Figure 3C:
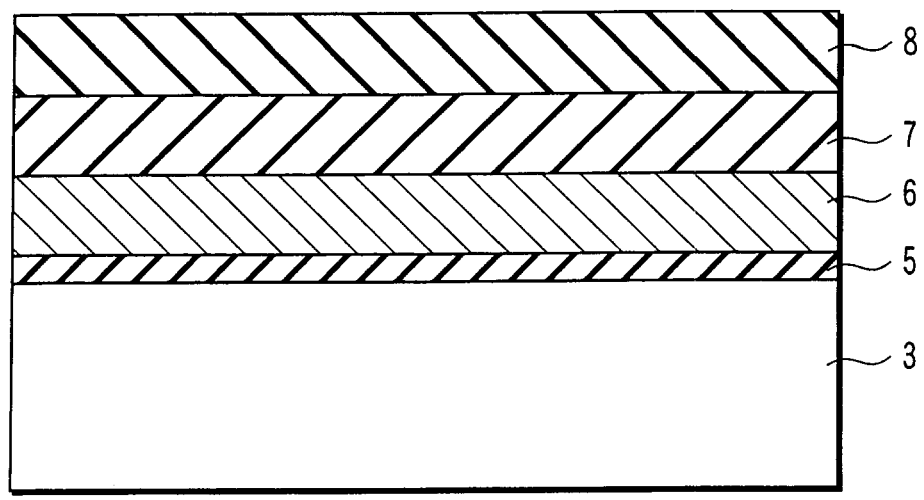

As shown in FIG. 3C, a polycrystal silicon film 6 to be a charge accumulation layer (first gate electrode) is provided on the surface of the silicon oxynitride film 5 by a CVD method. The polycrystal silicon film 6 is referred to also as a floating gate. Subsequently, a silicon nitride (SiN) film 7 and a silicon oxide ($SiO_2$) film 8 are successively provided on the surface of the polycrystal silicon film 6 by the CVD method.

As shown in FIG. 4A, a photoresist film 9 is provided on the surface of the silicon oxide film 8 by a spin-coating method. Then, a resist pattern is formed by using a normal lithography method, and the silicon oxide film 8 is etched to be processed based on the resist pattern.

As shown in FIG. 4B, the photoresist film 9 is removed from the surface of the silicon oxide film 8 processed into a predetermined pattern. Subsequently, the silicon nitride film 7, the polycrystal silicon film 6, the silicon oxynitride film 5 and the silicon substrate 3 are etched to be processed along their stacked direction by using the silicon oxide film 8 as a mask. As a result, a trench 10 along the predetermined pattern is formed in the silicon oxide film 8, the silicon nitride film 7, the polycrystal silicon film 6, the silicon oxynitride film 5 and the silicon substrate 3. Thereafter, the inner walls and the bottom portions of the trenches 10 are subject to the oxidizing process.

As shown in FIG. 5A, an embedding insulating film 11 is provided in the trenches 10 which have been subject to the oxidizing process by the plasma CVD method. As the embedding insulating film 11, a silicon oxide ($SiO_2$) film, for example, is used. The embedding insulating film 11 and the silicon oxide film 8 are ground to be flattened by a CMP method so that their height is equivalent with the surface of the silicon nitride film 7 by using the silicon nitride film 7 as a stopper.

As shown in FIG. 5B, the embedding insulating film 11 is selectively etched so that the surface of the embedding insulating film 11 reaches a position in the middle between the surface of the polycrystal silicon film 6 and the upper surface of the silicon oxynitride film 5. Then, the silicon nitride film 7 is removed from the surface of the polycrystal silicon film 6 by normal wet etching. As a result, the element separating structure is formed on the surface-layer portion of the silicon substrate 3.

Figure 6A:
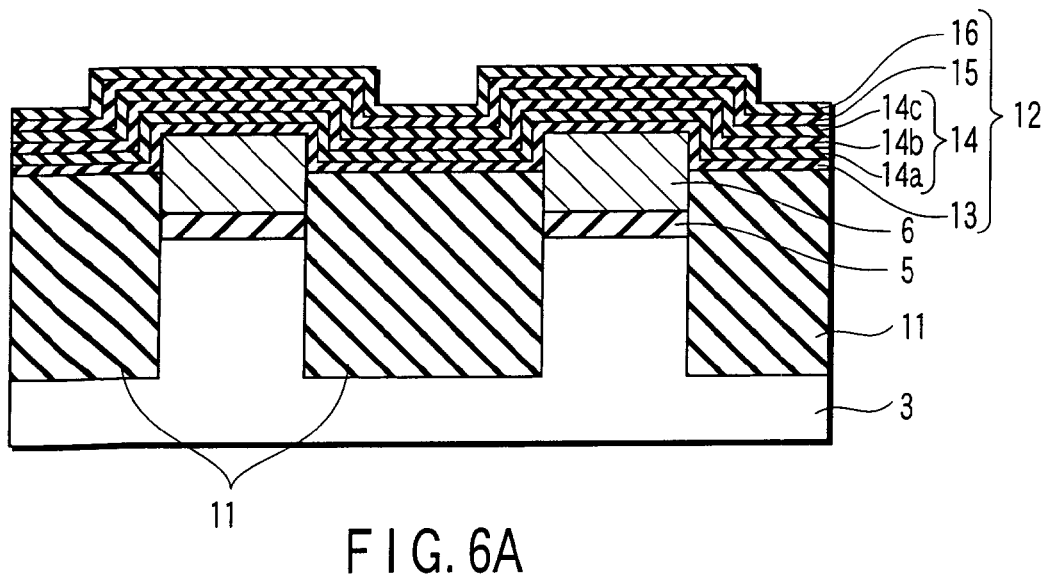
FIGS. 6A and 6B are sectional views taken along the break line A-A' in FIG. 1 illustrating the process of manufacturing the nonvolatile semiconductor memory device shown in FIG. 1.

As shown in FIG. 6A, a second gate insulating film 12 as the inter-electrode insulating film is provided onto the silicon substrate 3 where the element separating structure and a line and space pattern of the charge accumulation layer 6 have been formed. In the first embodiment, in order to prevent the formation of a bird's peak in the inter-electrode insulating film 12, three silicon nitride films and three silicon oxide films are stacked alternately so that the inter-electrode insulating film 12 is structured. That is, the inter-electrode insulating film 12 has a NONONO film structure such that the silicon nitride films and the silicon oxide films are stacked alternately into six layers. Details of a method of forming the inter-electrode insulating film 12 having the NONONO film structure will be described below specifically.

The polycrystal silicon film 6 to be the floating gate is subject to the dilute hydrofluoric acid process. As a result, a natural oxide film formed on the surface of the polycrystal silicon film 6 is removed. As shown in FIG. 6A, a second insulating film 13 to be the inter-electrode insulating film on the first layer which contains silicon and nitrogen is provided so as to directly cover the surface of the floating gate 6 from which the natural oxide film has been removed and the surface of the embedding insulating film 11. As the second insulating film, a first-layer silicon nitride (first SiN) film 13 is deposited. The first SiN film 13 may be deposited by, for example, an LP-CVD method or an atomic-layer-deposition (ALD)-CVD method.

As shown in FIG. 6A, a third insulating film 14 to be the second to fourth-layer inter-electrode insulating films is provided on the first SiN film 13. As the third insulating film 14, the following film is used. This film is composed of a single-layer insulating film containing oxygen or a plural-layer stacked insulating film whose top layer and bottom layer containing oxygen. The specific dielectric constant of the single-layer insulating film and the stacked insulating film is larger than the specific dielectric constant of a silicon oxide ($SiO_2$) film. The specific dielectric constant of the silicon oxide film is about 3.9. Therefore, as the third insulating film 14, an insulating film whose specific dielectric constant is larger than about 3.9 is formed. The third insulating film 14 is formed so as to have a three-layer structure where a middle-layer insulating film 14b containing silicon and nitrogen is sandwiched between upper and lower two insulating films 14a and 14c containing silicon and oxygen.

Specifically, the first-layer silicon oxide (first $SiO_2$) film 14a to be the second-layer inter-electrode insulating film is provided on the first SiN film 13. The second-layer silicon nitride (second SiN) film 14b to be the third-layer inter-electrode insulating film is provided onto the first $SiO_2$ film 14a. Then, the second-layer silicon oxide (second $SiO_2$) film 14c to be the fourth-layer inter-electrode insulating film is provided onto the second SiN film 14b. As a result, the third insulating film 14 having an ONO film structure, which is composed of the three-layer inter-electrode insulating film including the first $SiO_2$ film 14a, the second SiN film 14b and the second $SiO_2$ film 14c, is formed on the surface of the first SiN film 13 as the second insulating film. The first $SiO_2$ film 14a, the second SiN film 14b and the second $SiO_2$ film 14c may be successively deposited by the LP-CVD method. The relative dielectric constant of the third insulating film 14 having the ONO film structure is larger than about 3.9.

As shown in FIG. 6A, a fourth insulating film 15 containing silicon and nitrogen to be a fifth-layer inter-electrode insulating film is provided onto the second $SiO_2$ film 14c as the top-layer film of the third insulating film 14. Similarly the first SiN film 13 as the second insulating film, a third-layer silicon nitride (third SiN) film 15 is deposited as the fourth insulating film. The third SiN film 15 may be deposited by, for example, the LP-CVD method or the ALD-CVD method similarly to the first SiN film 13.

As shown in FIG. 6A, a fifth insulating film 16 containing silicon and oxygen to be a sixth-layer inter-electrode insulating film is provided onto the surface of the third SiN film 15. As the fifth insulating film, a third-layer silicon oxide (third $SiO_2$) film 16 is deposited similarly to the first $SiO_2$ film 14a as the lower-layer film of the third-insulating layer 14 and the second $SiO_2$ film 14c as the upper-layer film of the third insulating film 14. The third $SiO_2$ film 16 may be deposited by, for example, the LP-CVD method or the ALD-CVD method. The third $SiO_2$ film 16 is deposited in such a manner that its thickness is set to about 0.3 to 2.3 nm. The inter-layer insulating film 12 having a N/ONO/N/O film structure is formed on the silicon substrate 3 by the above steps so as to cover the surface of the floating gate 6 and the surface of the embedding insulating film 11. The inter-electrode insulating film 12 is composed of a six-layer stacked insulating film including the first SiN film 13 as the second insulating film, the first $SiO_2$ film 14a, the second SiN film 14b and the second $SiO_2$ film 14c as the third insulating film 14, the third SiN film 15 as the fourth insulating film, and the third $SiO_2$ film 16 as the fifth insulating film.

Figure 6B:
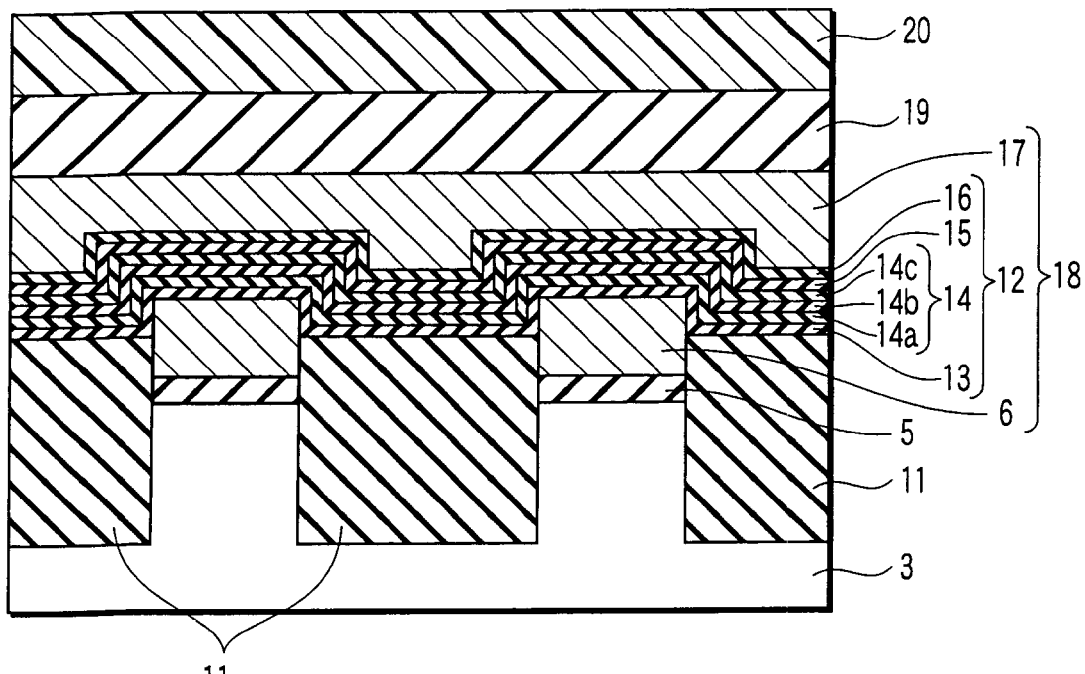

As shown in FIG. 6B, a polycrystal silicon film 17 to be a control gate (second gate electrode) is provided on the surface of the inter-electrode insulating film 12 by the LP-CVD method. The floating gate 6, the inter-electrode insulating film 12 and the control gate 17 compose an inter-polycapacitor 18. The inter-polycapacitor 18 is formed on the silicon substrate 3 so as to cover the surface of the tunnel gate insulating film 5 and the surface of the embedding insulating film 11. The control gate 17 serves as a word line.

Subsequently, a silicon nitride film 19 is provided on the surface of the polycrystal silicon film 17 by the LP-CVD method. A photoresist film 20 is provided on the surface of the silicon nitride film 19 by the spin-coating method. A resist pattern corresponding to the control gate 17 is formed on the photoresist film 20 by a normal lithography method. The silicon nitride film 19 is etched based on the resist pattern.

Figure 7A:
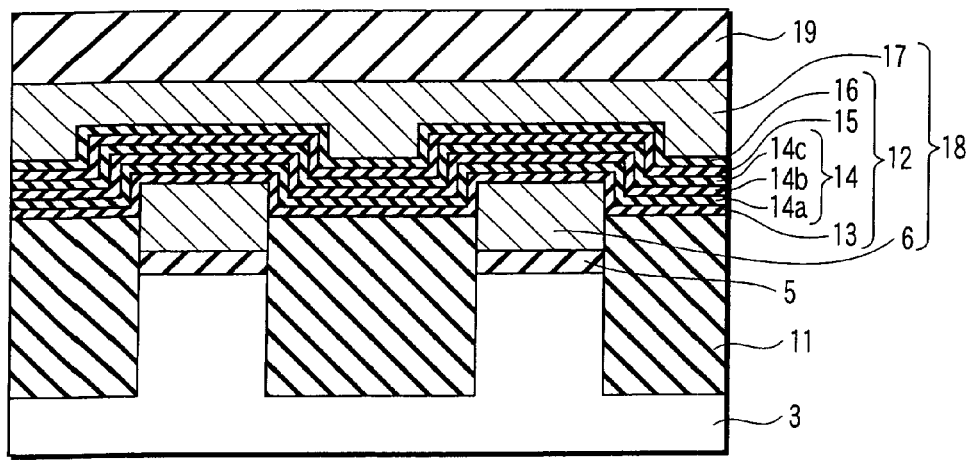
FIGS. 7A and 7B are sectional views taken along break line A-A' or B-B' in FIG. 1 illustrating the process of manufacturing the nonvolatile semiconductor memory device shown in FIG. 1.
Figure 7B:
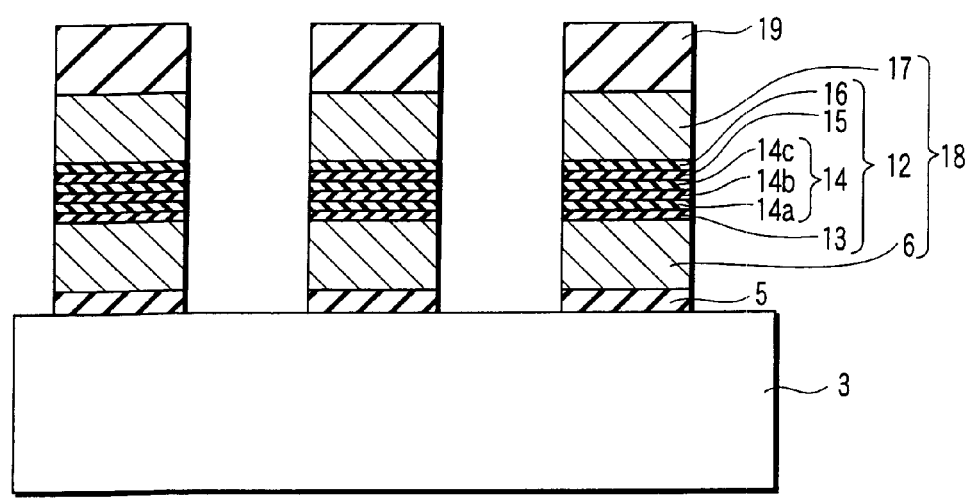

As shown in FIGS. 7A and 7B, the photoresist film 20 is removed from the surface of the silicon nitride film 19. The control gate 17, the inter-electrode insulating film 12, the floating gate 6 and the tunnel gate insulating film 5 are etched along their stacked direction by using the silicon nitride film 19 as a mask. As a result, as shown in FIG. 7B, a plurality of gate electrode structures are formed on the silicon substrate 3.

As shown in FIG. 8, a silicon oxide ($SiO_2$) film 21 is provided to sidewalls of the respective control gates 17, the respective inter-electrode insulating films 12, the respective floating gates 6 and the respective tunnel gate insulating films 5. The respective silicon oxide films 21 are formed by oxidizing the sidewalls of the control gates 17, the inter-electrode insulating films 12, the floating gates 6 and the tunnel gate insulating films 5 according to the thermal oxidizing method or the radical oxidizing method. This oxidizing process is executed in order to prevent a leakage current at the gate edges and improve the breakdown voltage of the gate insulating films. Further, the oxidizing process is executed in order to recover from damage on the gate oxide film via the gate electrode at an RIE process. The oxidizing process is generally referred to as a post-oxidizing process. A silicon oxide film 21 which is formed at the post-oxidizing process is generally referred to as a post-oxidized film.

As shown in FIG. 9, a plurality of selection gates 22 made of a polycrystal silicon film as well as the floating gates 6 and the control gates 17 are provided on the surface of the silicon substrate 3. Similarly to the control gates 17 and the floating gates 6, the silicon oxide films 21 as the sidewall-oxide films are provided to the sidewalls of the selection gates 22 and the sidewalls of the tunnel gate insulating films 5 below the selection gates 22, respectively.

As shown in FIG. 9, an impurity diffusing area 23 to be a source area 23a or a drain area 23b is formed on a plurality of places on the surface layer of the silicon substrate 3. The respective impurity diffusing areas 23 are formed on the surface layer of the silicon substrate 3 by implanting predetermined conductive ions (impurities) according to an ion implanting method by using the tunnel gate insulating films 5, the floating gates 6, the inter-electrode insulating films 12, the control gates 17, the silicon nitride films 19, the silicon oxide films 21 and the selection gates 22 as masks. Thereafter, the silicon substrate 3 into which the ions have been implanted is subject to a thermal annealing process to activate the ions in the impurity diffusing areas 23.

As shown in FIG. 9, a plurality of memory transistors 24 are provided on the surface layer of the silicon substrate 3 by the above steps. The memory transistor 24 is composed of the tunnel gate insulating film 5, the floating gate 6, the inter-electrode insulating film 12, the control gate 17, the silicon nitride film 19, the silicon oxide film 21, the source area 23a and the drain area 23b. These memory transistors 24 are connected to each other in series so as to be formed. A plurality of selection transistors 25a are provided on the surface layer of the silicon substrate 3. The selection transistor 25a is composed of the tunnel gate insulating film 5, the selection gate 22, the inter-electrode insulating film 12, the silicon nitride film 19, the silicon oxide film 21, the source area 23a and the drain area 23b. These selection transistors 25a as well as the memory transistors 24 compose memory cells 26.

As shown in FIG. 9, a bit line 27, and a contact plug 28 which electrically connects the bit line 27 and the drain areas 23b are formed. The bit line 27 is formed so as to be extended along a direction orthogonal to a direction where the control gate 17 to be the word line extends (longitudinal direction). A main portion of the memory array cell portion 2 of the NAND-type flash memory 1 according to the first embodiment having a plurality of memory cells 26 is formed by the above steps.

The floating gates 6, the inter-electrode insulating films 12, the control gates 17, the silicon nitride films 19, the selection gates 22, the bit line 27 and the contact plug 28 are provided actually on any one of the plural inter-electrode insulating films provided on the silicon substrate 3 in a stacked manner. In FIG. 9, for easy viewing of the drawing, the plurality of inter-electrode insulating films provided on the silicon substrate 3 in the stacked manner is collectively shown as one inter-electrode insulating film 29. Similarly, a barrier metal film is generally provided to the bit line 27 and the contact plug 28 so as to cover their surfaces. In FIG. 9, however, for easy viewing of the drawing, the barrier metal film is not illustrated. This omission of illustration is similarly applied also to FIGS. 12, 14, 16 and 21 in second to fifth embodiments described later.

The concrete and detailed description with reference to the drawings is omitted, but the floating-gate rewritable nonvolatile semiconductor memory device (nonvolatile memory) 1 according to the first embodiment having a desired structure shown in FIGS. 7A and 9 is obtained by the predetermined post-process. That is, the NAND-type flash memory 1 which has a plurality of memory transistors 24 having the NON-ONO film structure is obtained. The inter-electrode insulating film 12 of the memory transistor 24 is composed of the six-layer stacked insulating films where the first SiN film 13, the first SiO₂ film 14a, the second SiN film 14b, the second SiO₂ film 14c, the third SiN film 15 and the third SiO₂ film 16 are deposited in this order in a direction from the floating gate 6 to the control gate 17.

FIGS. 3A to 3C, 4A, 4B, 5A, 5B, 6A, 6B and 7A are sectional views taken along a direction where the word line (control gate) 12 of the flash memory 1 extends (longitudinal direction). On the contrary, FIGS. 7B, 8 and 9 are sectional views taken along a direction where the bit line 27 of the flash memory 1 extends (longitudinal direction) orthogonal to the direction where the word line 17 extends. Such an illustrating way is similarly applied also to FIGS. 11A to 16, and 20A to 21 to be referred to in the second to fifth embodiments.

Characteristics of the inter-electrode insulating film 12 having the NONONO structure according to the first embodiment will be described below.

As described in the background of the invention, the ONO film structure composed of a three-layer stacked insulating film including a SiO₂ film, a SiN film and a SiO₂ film stacked in this order in the direction from the floating gate to the control gate is often applied to the past inter-electrode insulating films. Such a technique is described in, for example, S. Aritome et al., "Reliability Issue of Flash Memory Cells" Proceedings of the IEEE, 1993, vol. 81, No. 5, pp. 777-788, Jung-Dal Choi et al. or "Highly manufacturable 1 Gb NAND flash using 0.12 μm process technology" in IEDM Technical Digest. 2001, pp. 25-26. When a silicon oxide film as a post-oxide film is formed on the sidewall of an inter-electrode insulating film having the ONO film structure by the post-oxidizing process, a bird's beak might be formed in the inter-electrode insulating film. In such a case, in order to prevent the formation of the bird's beak in the inter-electrode insulating film, it is easy and effective to form a silicon nitride (SiN) film between the inter-electrode insulating film and the floating gate or between the inter-electrode insulating film and the control gate. That is, when the silicon nitride film is inserted between a polycrystal silicon film to be the floating gate or the control gate and a silicon oxide (SiO₂) film adjacent to the polycrystal silicon film in the inter-electrode insulating film, the formation of the bird's beak in the inter-electrode insulating film can be prevented efficiently and easily.

However, when the SiN film is simply inserted between the inter-electrode insulating film and the floating gate or the control gate, the bird's beak in the inter-electrode insulating film can be prevented, but its adverse effect causes the charge retention property and electrical reliability, etc., of the inter-polycapacitor to deteriorate. This results in a disturbance of the whole operation of the NAND-type flash memory as the floating-gate nonvolatile semiconductor memory device, leading to deterioration of the device characteristics of the NAND-type flash memory.

In the first embodiment, the film structure of the inter-electrode insulating film 12 is the NONONO film structure which is composed of the six-layer stacked insulating film including the first SiN film 13, the first SiO₂ film 14a, the second SiN film 14b, the second SiO₂ film 14c, the third SiN film 15 and the third SiO₂ film 16 arranged in this order in the direction from the floating gate 4 to the control gate 17. Also, the thickness of the third SiO₂ film 16 which directly contacts with the control gate 17 composed of a polycrystal silicon film is controlled to be about 0.3 to 2.3 nm. Such a structure allows prevention of the formation of the bird's beak in the inter-electrode insulating film 12, and of deterioration of the electrical properties and the device characteristics of the inter-polycapacitor 18 and the NAND-type flash memory 1.

FIG. 10 is a sold-line graph illustrating a relationship between the thickness of the third SiO₂ film 16 and a bird's beak forming behavior in the inter-electrode insulating film 12 of the first embodiment having the NONONO film structure inspected by an inventors' experiment. FIG. 10 is an alternate long and short dash line graph illustrating a relationship between the thickness of the third SiO₂ film 16 and the charge retention property of the inter-polycapacitor 18.

An abscissa axis of the graph shown in FIG. 10 expresses the thickness of the third SiO₂ film 16. An ordinate axis on the left of the graph in FIG. 10 expresses a ratio of an equivalent oxide thickness (EOT) in the capacitor structure to an equivalent oxide thickness (EOT) in a plane capacitor structure. In the capacitor structure, a line and space pattern (L/S pattern) is inscribed along the direction of the control gate. In general, when the bird's beak is formed in the inter-electrode insulating film in the capacitor having a gate structure, the equivalent oxide thickness increases. Therefore, the ratio of the equivalent oxide thickness in the plane capacitor structure to the equivalent oxide thickness in the gate structure (line and space pattern structure) is used as an indicator of the bird's beak forming condition in the inter-electrode insulating film. When the bird's beak is not formed in the inter-electrode insulating film, the equivalent oxide thickness ratio (EOT ratio) is expressed as 1.

An ordinate axis on the right of the graph in FIG. 10 expresses a shift amount ΔVth of a threshold of the cell transistor 24 in the NAND-type flash memory 1. ΔVth specifically means a fluctuation amount of the threshold Vth after the threshold Vth of the memory transistor 24 is set to about 2V and the transistor 24 is left to stand at about 150° C. for 2 hours. In general, when the charge retention property of the inter-polycapacitor 18 deteriorates, the shift amount ΔVth of the threshold of the cell transistor 24 increases. This phenomenon is used here, and the shift amount ΔVth of the threshold of the cell transistor 24 is used as an indicator of the charge retention property of the inter-polycapacitor 18.

The graph expressed by the solid line in the two graphs of FIG. 10 shows that when the thickness of the third SiO₂ film 16 exceeds about 2.3 nm in the NONONO film structure, the EOT ratio rapidly rises. That is, the thickness of the third SiO₂ film 16 which directly contacts with the control gate 17 exceeds about 2.3 nm, the bird's peak is rapidly at high risk of being formed in the inter-electrode insulating film 12. This is because when the thickness of the third SiO₂ film 16 is not less than about 2.3 nm, oxidant easily intrudes into the third SiO₂ film 16 at the post-oxidizing process for forming the post-oxide film 21.

On the contrary, when the thickness of the third SiO₂ film 16 is not more than about 2.3 nm, the EOT ratio is about 1. That is, when the thickness of the third SiO₂ film 16 is not more than about 2.3 nm, it is difficult that the oxidant intrudes into the third SiO₂ film 16 at the post-oxidizing process. This makes it difficult for the bird's beak to be formed in the third SiO₂ film 16. Therefore, in order to prevent the formation of the bird's beak in the inter-electrode insulating film 12 having the NONONO film structure, the thickness of at least the third SiO₂ film 16 directly in contact with the control gate 17 in the first to third SiN films 13, 14b and 15 and the first to third SiO₂ films 14a, 14c and 16 of the inter-electrode insulating film 12 may be set to not more than about 2.3 nm.

The alternate long and short dash line graph in the two graphs of FIG. 10 shows that when the thickness of the third SiO₂ film 16 becomes less than about 0.3 nm in the NONONO film structure, the shift amount ΔVth of the threshold of the memory transistor 24 rapidly rises. That is, when the thickness of the third SiO₂ film 16 directly in contact with the control gate 17 is less than about 0.3 nm, the charge retention property of the inter-polycapacitor 18 rapidly reaches a high risk of deteriorating. This is because when the thickness of the third SiO$_2$ film 16 is less than about 0.3 nm, a levels and the density of an interface trap on the interface between the third SiO$_2$ film 16 and the control gate 17 rapidly increase.

According to the inventors' experiment, therefore, the third SiO$_2$ film 16 to be inserted into the interface between the control gate 17 made of the polycrystal silicon film and the inter-electrode insulating film 12 having the NONONO structure is desirably formed into an extremely thin film shape with thickness of about 0.3 nm to 2.3 nm. The inter-electrode insulating film 12 in the first embodiment is formed into the NONONO structure which is made of the six-layer stacked insulating film where the first SiN film 13, the first SiO$_2$ film 14a, the second SiN film 14b, the second SiO$_2$ film 14c, the third SiN film 15 and the third SiO$_2$ film 16 are deposited in this order in the direction from the floating gate 4 to the control gate 17. In the inter-electrode insulating film 12, the third SiO$_2$ film 16 directly in contact with the control gate 17 made of the polycrystal silicon film is formed into the extremely thin film shape with thickness of about 0.3 to 2.3 nm. That is, the SiO$_2$ film 16 is sandwiched near the electrode of the control gate 17.

According to such a structure, the formation of the bird's beak in the third SiO$_2$ film 16 (inter-electrode insulating film 12) can be prevented near the electrode of the control gate 17. Since the third SiO$_2$ film 16 to be inserted into the interface between the control gate 17 and the inter-electrode insulating film 12 is extremely thin, the satisfactory end shape of the insulating film can be obtained similarly to the NONON film structure. The electrical properties and the electrical reliability of the inter-electrode insulating film 12 can be improved.

According to the first embodiment, it is possible to improve the quality, the electrical reliability and the electrical properties, etc., of the inter-electrode insulating film 12 having the NONONO film structure. As a result, as to the inter-polycapacitor 18 in the first embodiment having the inter-electrode insulating film 12, its charge retention property, device characteristics and electrical reliability, etc., are improved. Consequently, the device characteristics, the electrical reliability, the performance and the quality, etc., of the NAND-type flash memory 1 having a plurality of inter-polycapacitors 18 are improved.

Second Embodiment

A second embodiment of the present invention is described below with reference to FIGS. 11 and 12. FIGS. 11 and 12 are sectional views illustrating a process of manufacturing the nonvolatile semiconductor memory device according to the second embodiment. The same members as those in the first embodiment are denoted by the same reference numerals, and the detailed description thereof is omitted.

In the second embodiment, similarly to the inter-electrode insulating film 12 of the first embodiment, the inter-electrode insulating film is formed into a structure where silicon nitride films and silicon oxide films are alternately stacked into six layers. Differently from the inter-electrode insulating film 12 of the first embodiment, in the second embodiment, one more silicon oxide film is added below the NONON film, so that an ONONON film structure is formed. That is, in the second embodiment, a silicon oxide film is inserted between the floating gate and the NONON film. As a result, similarly to the first embodiment, the formation of a bird's beak in the inter-electrode insulating film is prevented to thereby improve the electrical properties, the reliability, the performance and the quality, etc. The details are described below specifically.

Figure 11A:
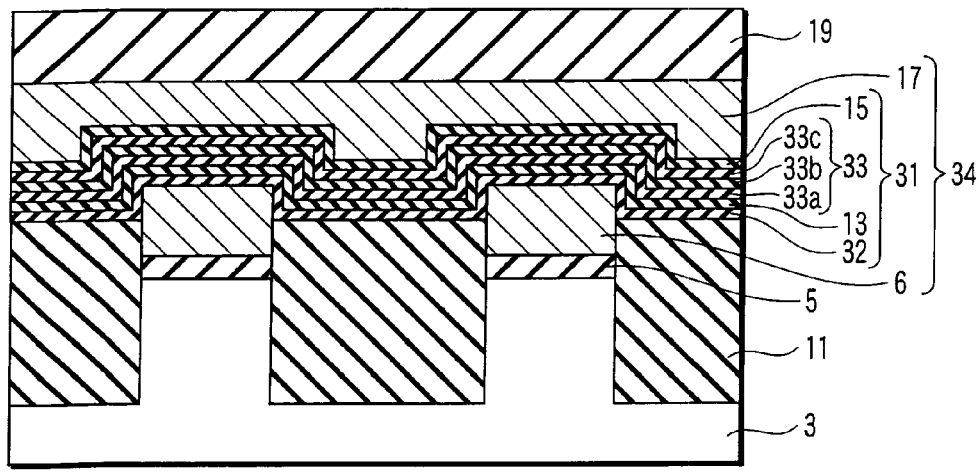
FIGS. 11A and 11B are sectional views illustrating a process of manufacturing a nonvolatile semiconductor memory device according to a second embodiment.
Figure 12:
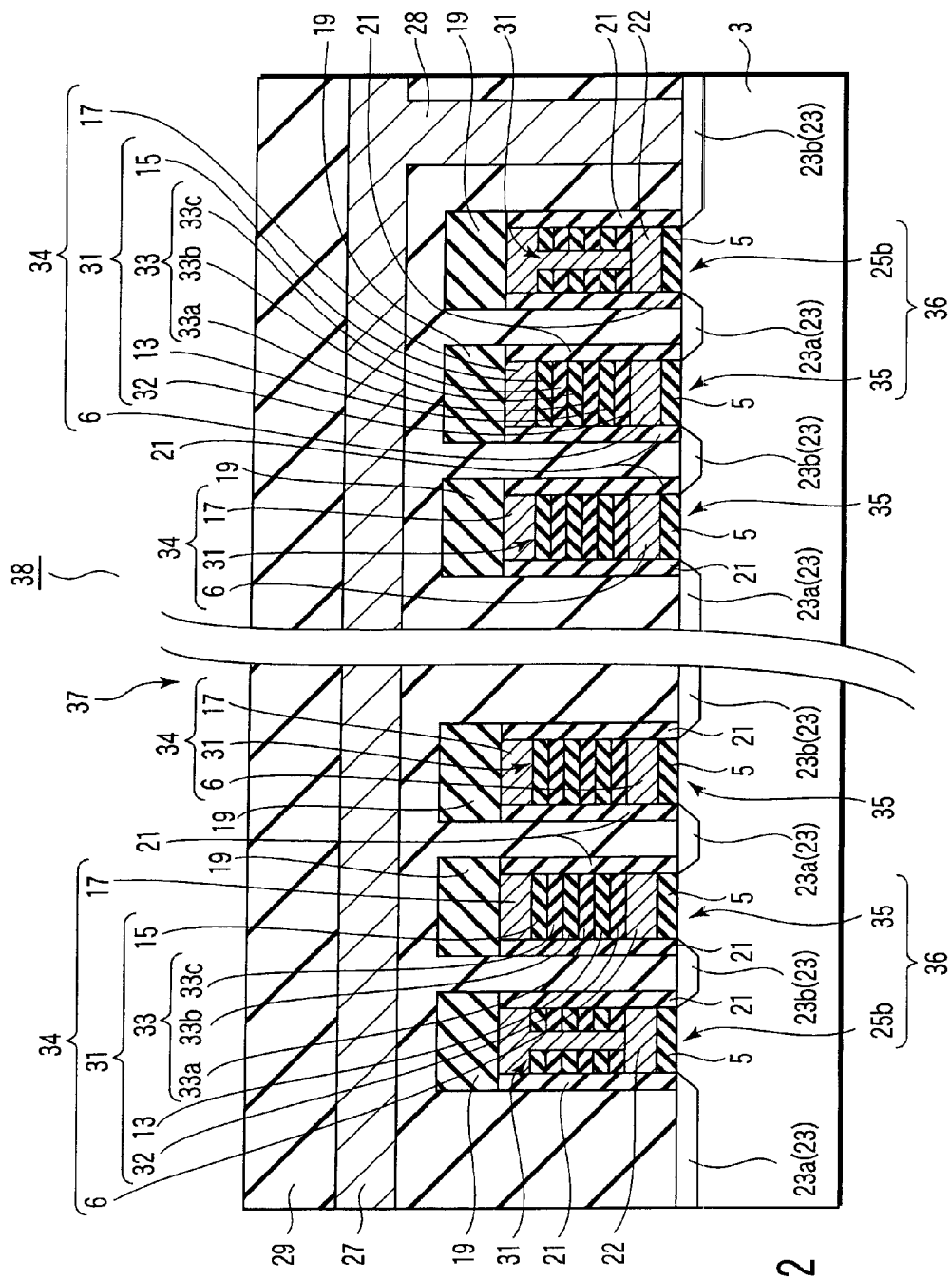
FIG. 12 is a sectional view illustrating the process of manufacturing the nonvolatile semiconductor memory device according to the second embodiment.

As shown in FIG. 11A, the steps up to the step of forming the element separating structure and the line and space pattern of the charge accumulation layer 6 on the surface layer of the silicon substrate 3 are similar to the steps described in the first embodiment with reference to FIGS. 3A to 5B.

Figure 11B:
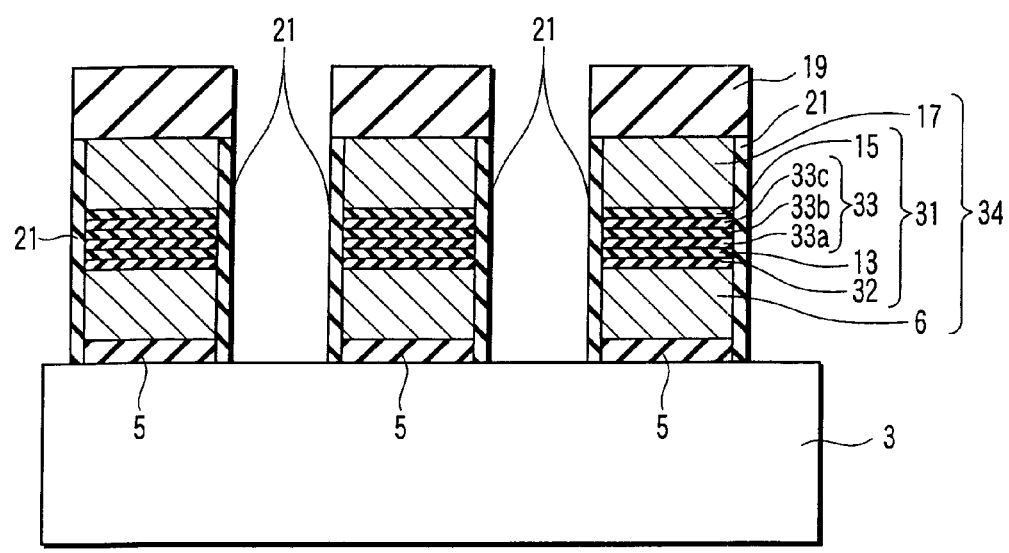

As shown in FIGS. 11A and 11B, an inter-electrode insulating film 31 having the ONONON film structure is provided on the silicon substrate 3 formed with the element separating structure and the line and space pattern of the charge accumulation layer 6. Specifically, similarly to the first embodiment, the polycrystal silicon film 6 to be the floating gate is subject to the dilute hydrofluoric acid process, so that a natural oxide film formed on the surface of the polycrystal silicon film 6 is removed. Then, the polycrystal silicon film 6 is subject to a surface treatment using a solution having hydrogen peroxide (H$_2$O$_2$) added therein or a solution having ozone (O$_3$) added therein. As a result, a first SiO$_2$ film 32 as a fifth insulating film containing silicon and oxygen is provided onto the surface layer of the polycrystal silicon film 6. The first SiO$_2$ film 32 which directly contacts with the polycrystal silicon film 6 is deposited so as to have a thickness of about 0.3 to 2.3 nm similarly to the third SiO$_2$ film 16 in the first embodiment. After the first SiO$_2$ film 32 is deposited, cleaning with pure water may be carried out as the need arises.

Subsequently, the first SiN film 13 as a second insulating film containing silicon and nitrogen is provided on the first SiO$_2$ film 32. A third insulating film 33 having an ONO film structure composed of a second SiO$_2$ film 33a, a second SiN film 33b and a third SiO$_2$ film 33c is provided on the first SiN film 13. The third SiN film 15 as a fourth insulating film containing silicon and nitrogen is provided on the third SiO$_2$ film 33c. The first SiN film 13, the second SiO$_2$ film 33a, the second SiN film 33b, the third SiO$_2$ film 33c and the third SiN film 15 are deposited sequentially by the steps similar to the first embodiment. In these steps, the inter-electrode insulating film 31 having an O/N/ONO/N film structure is formed on the silicon substrate 3 so as to cover the surface of the floating gate 6 and the surface of the embedding insulating film 11 as shown in FIGS. 11A and 11B. The inter-electrode insulating film 31 is composed of a six-layer stacked insulating film including the first SiO$_2$ film 32 as the fifth insulating film, the first SiN film 13 as the second insulating film, the second SiO$_2$ film 33a, the second SiN film 33b and the third SiO$_2$ film 33c as the third insulating film 33, and the third SiN film 15 as the fourth insulating film.

As shown in FIGS. 11A and 11B, in the steps similar to the first embodiment, an inter-polycapacitor 34 composed of the floating gate 6, the inter-electrode insulating film 31 and the control gate 17 is formed on the silicon substrate 3. As shown in FIG. 11B, the silicon oxide (SiO$_2$) film 21 as the post-oxide film is provided on the sidewalls of the control gates 17, the inter-electrode insulating films 31, the floating gates 6 and the tunnel gate insulating films 5.

As shown in FIG. 12, in the step similar to the first embodiment, a plurality of memory transistors 35 are provided on the surface layer of the silicon substrate 3. The memory transistor 35 is composed of the tunnel gate insulating film 5, the floating gate 6, the inter-electrode insulating film 31, the control gate 17, the silicon nitride film 19, the silicon oxide film 21, the source area 23a and the drain area 23b. A plurality of selection transistors 25b are provided on the surface layer of the silicon substrate 3. The selection transistor 25b is composed of the tunnel gate insulating film 5, the selection gate 22, the inter-electrode insulating film 31, the silicon nitride film 19, the silicon oxide film 21, the source area 23a and the drain area 23b. The selection transistors 25b as well as the memory transistors 35 compose memory cells 36. The bit line 27 and the contact plug 28 are provided on the silicon substrate 3, to thereby form a main section of the memory cell array portion of the NAND-type flash memory 38 in the second embodiment having the plurality of memory cells 36.

Thereafter, concrete and detailed description with reference to the drawings is omitted, but the floating-gate rewritable nonvolatile semiconductor memory device (nonvolatile memory) 38 according to the second embodiment having the desired structure shown in FIGS. 11A and 12 is obtained by the predetermined post-process. That is, the NAND-type flash memory 38 having the plurality of memory transistors 35 with the ONONON film structure is obtained. In the ONONON film structure, the inter-electrode insulating film 31 is composed of the six-layer stacked insulating film where the first $SiO_2$ film 32, the first SiN film 13, the second $SiO_2$ film 33a, the second SiN film 33b, the third $SiO_2$ film 33c and the third SiN film 15 are stacked in this order in the direction from the floating gate 6 to the control gate 17.

A relationship among the thickness of the first $SiO_2$ film 32 and the bird's beak forming behavior and the charge retention property in the inter-electrode insulating film 31 of the second embodiment having the ONONON film structure is similar to the relationship among the thickness of the third $SiO_2$ film 16 and the bird's beak forming behavior and the charge retention property in the inter-electrode insulating film 12 having the NONONO film structure described in the first embodiment with reference to FIG. 10.

In the second embodiment, the inter-electrode insulating film 31 is formed into the ONONON film structure which is composed of the six-layer stacked insulating film including the first $SiO_2$ film 32, the first SiN film 13, the second $SiO_2$ film 33a, the second SiN film 33b, the third $SiO_2$ film 33c and the third SiN film 15. In the inter-electrode insulating film 31, the first $SiO_2$ film 32 which directly contacts with the floating gate 6 composed of the polycrystal silicon film is formed into an extremely thin film shape with thickness of about 0.3 to 2.3 nm. That is, the extremely thin $SiO_2$ film 32 is inserted near the electrode of the floating gate 6.

According to such a structure, the effect similar to that in the first embodiment can be obtained. According to the second embodiment, similarly to the first embodiment where the formation of the bird's beak in the third $SiO_2$ film 16 (inter-electrode insulating film 12) is prevented near the electrode of the control gate 17, the formation of the bird's beak in the first $SiO_2$ film 32 (inter-electrode insulating film 31) can be prevented near the electrode of the floating gate 6.

Further, the electrical properties and the electrical reliability, etc., of the inter-electrode insulating film 31 can be improved.

According to the second embodiment, therefore, the quality, the electrical reliability and the electrical properties, etc., of the inter-electrode insulating film 31 having the ONONON structure are improved. This also allows improvement of the charge retention property, the device characteristics and the electrical reliability, etc., of the inter-polycapacitor 34 in the second embodiment having the inter-electrode insulating film 31. Eventually, the device characteristics, the electrical reliability, the performance and the quality, etc., of the NAND-type flash memory 38 having the plurality of inter-polycapacitors 34 are improved.

Third Embodiment

Figure 14:
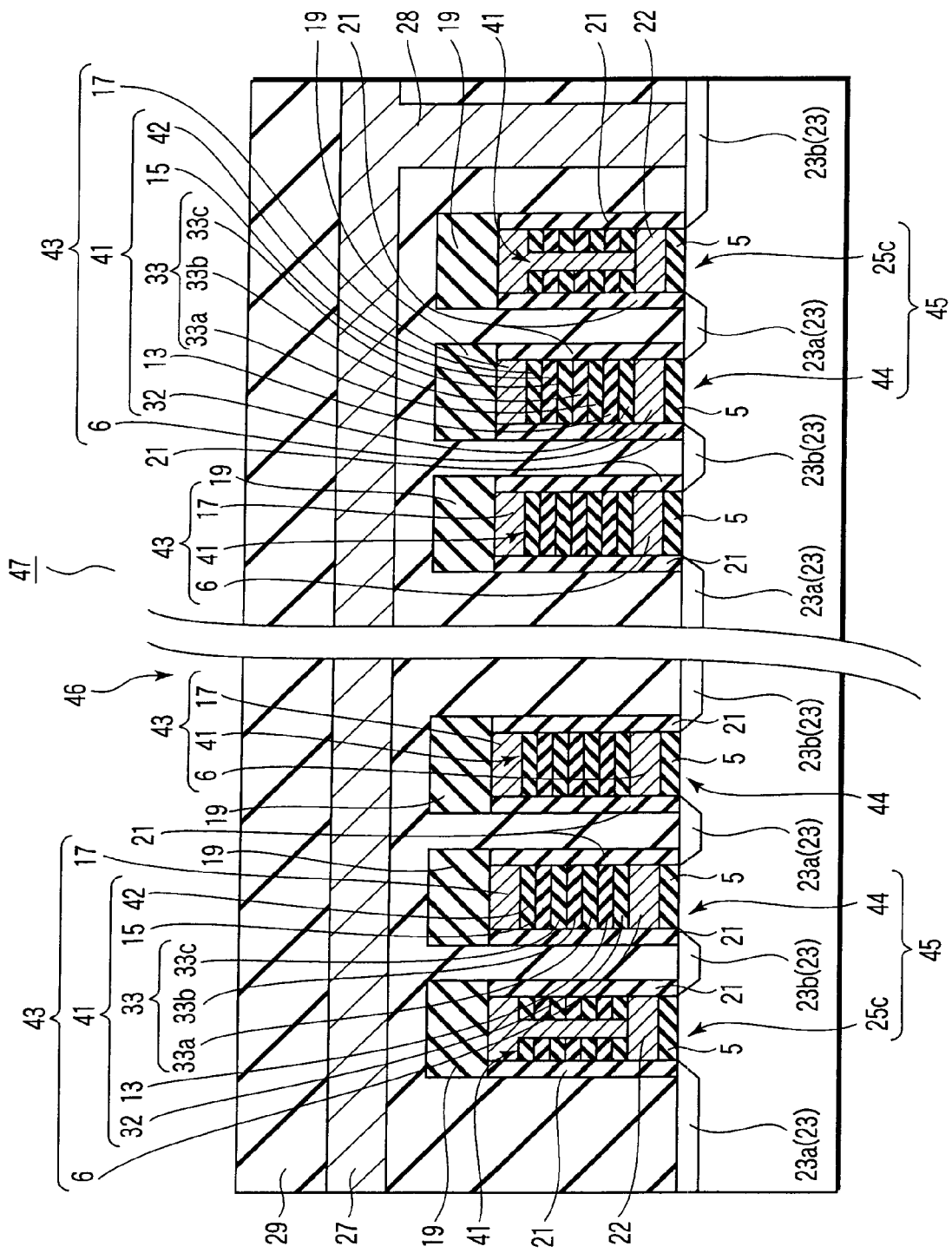
FIG. 14 is a sectional view illustrating the process of manufacturing the nonvolatile semiconductor memory device according to the third embodiment.

A third embodiment of the present invention will be described below with reference to FIGS. 13 and 14. FIGS. 13 and 14 are sectional views illustrating the steps of manufacturing the nonvolatile semiconductor memory device according to the third embodiment. The same portions as those in the first and second embodiments are denoted by the same reference numerals, and the detailed description thereof is omitted.

In the third embodiment, differently from the inter-electrode insulating films 12 and 31 in the first and second embodiments, the inter-electrode insulating film is formed by stacking silicon nitride films and silicon oxide films alternately into seven layers. Specifically, the inter-electrode insulating film is an ONONONO film where the one silicon oxide film is added to both the upper and lower surfaces of the NONON film. That is, one silicon oxide film is inserted between the control gate and the floating gate and between the control gate and the NONON film, to thereby form the inter-electrode insulating film composed of a combination of the inter-electrode insulating films 12 and 31. As a result, similarly to the first and second embodiments, the formation of a bird's beak in the inter-electrode insulating film is prevented, so that its electrical properties, its reliability, its performance and its quality, etc., are improved. The details will be specifically described below.

As shown in FIG. 13A, the steps up to the step of forming the element separating structure and the line and space pattern of the charge accumulation layer 6 on the surface layer of the silicon substrate 3 are similar to the steps described in the first embodiment with reference to FIGS. 3A to 5B.

As shown in FIGS. 13A and 13B, an inter-electrode insulating film 41 having an ONONONO film structure is provided on the silicon substrate 3 formed with the element separating structure and the line and space pattern of the charge accumulation layer 6. Specifically, in the steps similar to those in the second embodiment, a six-layer stacked insulating film is provided on the surface layer of the polycrystal silicon film 6. The six-layer stacked insulating film is composed of the first $SiO_2$ film 32 as the fifth insulating film on the lower layer, the first SiN film 13 as the second insulating film, the first $SiO_2$ film 33a, the second SiN film 33b and the second $SiO_2$ film 33c as the third insulating film 33, and the third SiN film 15 as the fourth insulating film. Similarly to the case where the first $SiO_2$ film 32 is provided in the second embodiment, the third SiN film 15 is subject to the surface treatment using the solution having hydrogen peroxide ($H_2O_2$) added therein or the solution having ozone ($O_3$) added therein. As a result, a fourth $SiO_2$ film 42 as the fifth insulating film on the upper layer containing silicon and oxygen is provided on the surface layer of the third SiN film 15.

In these steps, as shown in FIGS. 13A and 13B, the inter-electrode insulating film 41 having an O/N/ONO/N/O film structure is formed on the silicon substrate 3 so as to cover the surface of the floating gate 6 and the surface of the embedding insulating film 11. The inter-electrode insulating film 41 is composed of a seven-layer stacked insulating film including the first $SiO_2$ film 32 as one fifth insulating film, the first SiN film 13 as the second insulating film, the second $SiO_2$ film 33a, the second SiN film 33b and the third $SiO_2$ film 33c as the third insulating film 33, the third SiN film 15 as the fourth insulating film, and the fourth $SiO_2$ film 42 as the other fifth insulating film. The first SiO₂ film 32 and the fourth SiO₂ film 42 which directly contact with the floating gate 6 and the control gate 17 made of the polycrystal silicon film, respectively, are deposited so as to have thicknesses of about 0.3 to 2.3 nm similarly to the third SiO₂ film 16 of the first embodiment and the first SiO₂ film 32 of the second embodiment.

As shown in FIGS. 13A and 13B, in the steps similar to those in the first and second embodiments, an inter-polycapacitor 43 composed of the floating gate 6, the inter-electrode insulating film 41 and the control gate 17 is formed on the silicon substrate 3. As shown in FIG. 13B, the silicon oxide (SiO₂) film 21 as the post-oxide film is provided on the sidewalls of the control gates 17, the inter-electrode insulating films 41, the floating gates 6 and the tunnel gate insulating films 5.

As shown in FIG. 14, in the steps similar to those in the first and second embodiments, a plurality of memory transistors 44 are provided on the surface layer of the silicon substrate 3. The memory transistor 44 is composed of the tunnel gate insulating film 5, the floating gate 6, the inter-electrode insulating film 41, the control gate 17, the silicon nitride film 19, the silicon oxide film 21, the source area 23a and the drain area 23b. A plurality of selection transistors 25c are provided on the surface layer of the silicon substrate 3. The selection transistor 25c is composed of the tunnel gate insulating film 5, the selection gate 22, the inter-electrode insulating film 41, the silicon nitride film 19, the silicon oxide film 21, the source area 23a and the drain area 23b. The selection transistors 25c as well as the memory transistors 44 compose memory cells 45. The bid line 27 and the contact plug 28 are provided on the silicon substrate 3, thereby to form a main portion of a memory cell array portion 46 of a NAND-type flash memory 47 in the third embodiment having the plurality of memory cells 45.

Hereinafter, concrete and detailed description with reference to the drawings is omitted, but a floating-gate rewritable nonvolatile semiconductor memory device (nonvolatile memory) 47 according to the third embodiment having the desired structures shown in FIGS. 13A and 14 is obtained by the predetermined post-process. That is, the NAND-type flash memory 47 having a plurality of memory transistors 44 is obtained. In the memory transistor 44, the inter-electrode insulating film 41 is formed into an ONONONO film structure composed of the seven-layer stacked insulating film in which the first SiO₂ film 32, the first SiN film 13, the second SiO₂ film 33a, the second SiN film 33b, the third SiO₂ film 33c, the third SiN film 15, and the fourth SiO₂ film 42 are disposed in this order in the direction from the floating gate 6 to the control gate 17.

A relationship among the thickness of the fourth SiO₂ film 42 and the bird's beak forming behavior and the charge retention property in the inter-electrode insulating film 41 of the third embodiment having the ONONONO film structure is similar to the relationship among the thickness of the third SiO₂ film 16 and the bird's beak forming behavior and the charge retention property in the inter-electrode insulating film 12 having the NONONO film structure explained in the first embodiment with reference to FIG. 10. A relationship among the thickness of the first SiO₂ film 32 and the bird's beak forming behavior and the charge retention property in the inter-electrode insulating film 41 is similar to the relationship among the thickness of the first SiO₂ film 32 and the bird's beak forming behavior and the charge retention property in the inter-electrode insulating film 31 of the second embodiment having the ONONON film structure.

In the third embodiment, the inter-electrode insulating film 41 is formed into the ONONONO film structure which is composed of the seven-layer stacked insulating film including the first SiO₂ film 32, the first SiN film 13, the second SiO₂ film 33a, second SiN film 33b, the third SiO₂ film 33c, the third SiN film 15 and the fourth SiO₂ film 42. In the inter-electrode insulating film 41, the first SiO₂ film 32 which directly contacts with the floating gate 6 made of the polycrystal silicon film and the fourth SiO₂ film 42 which directly contacts with the control gate 17 made of the polycrystal silicon film are formed into an extremely thin film shape with thickness of about 0.3 to 2.3 nm. That it, the SiO₂ films 32 and 42 as the extremely thin films are inserted near the electrodes of the floating gate 6 and the control gate 17, respectively.

According to such a structure, both the effects of the first and second embodiments can be obtained. According to the third embodiment, similarly to the first embodiment, the formation of the bird's beak in the fourth SiO₂ film 42 (inter-electrode insulating film 41) can be prevented near the electrode of the control gate 17. Further, similarly to the second embodiment, the formation of the bird's beak in the first SiO₂ film 32 (inter-layer insulating film 41) can be prevented near the electrode of the floating gate 6. Both the first SiO₂ film 32 to be inserted into the interface between the floating gate 6 and the inter-electrode insulating film 41, and the fourth SiO₂ film 42 to be inserted into the interface between the control gate 17 and the inter-electrode insulating film 41 are extremely thin. For this reason, the satisfactory gate edge shape of the insulating film can be obtained similarly to the NONON film structure. Also, it is possible to further improve the electrical properties and the electrical reliability, etc., of the inter-electrode insulating film 41.

According to the third embodiment, the quality, the electrical reliability and the electrical properties, etc., of the inter-electrode insulating film 41 having the ONONONO film structure are further improved. As a result, also as to the inter-polycapacitor 43 of the third embodiment having the inter-electrode insulating film 41, its charge retention property, its device properties and its electrical reliability, etc., are improved. Eventually, the device characteristics, the electrical reliability, the performance and the quality, etc., of the NAND-type flash memory 47 having a plurality of inter-polycapacitors 43 are improved.

Fourth Embodiment

Figure 16:
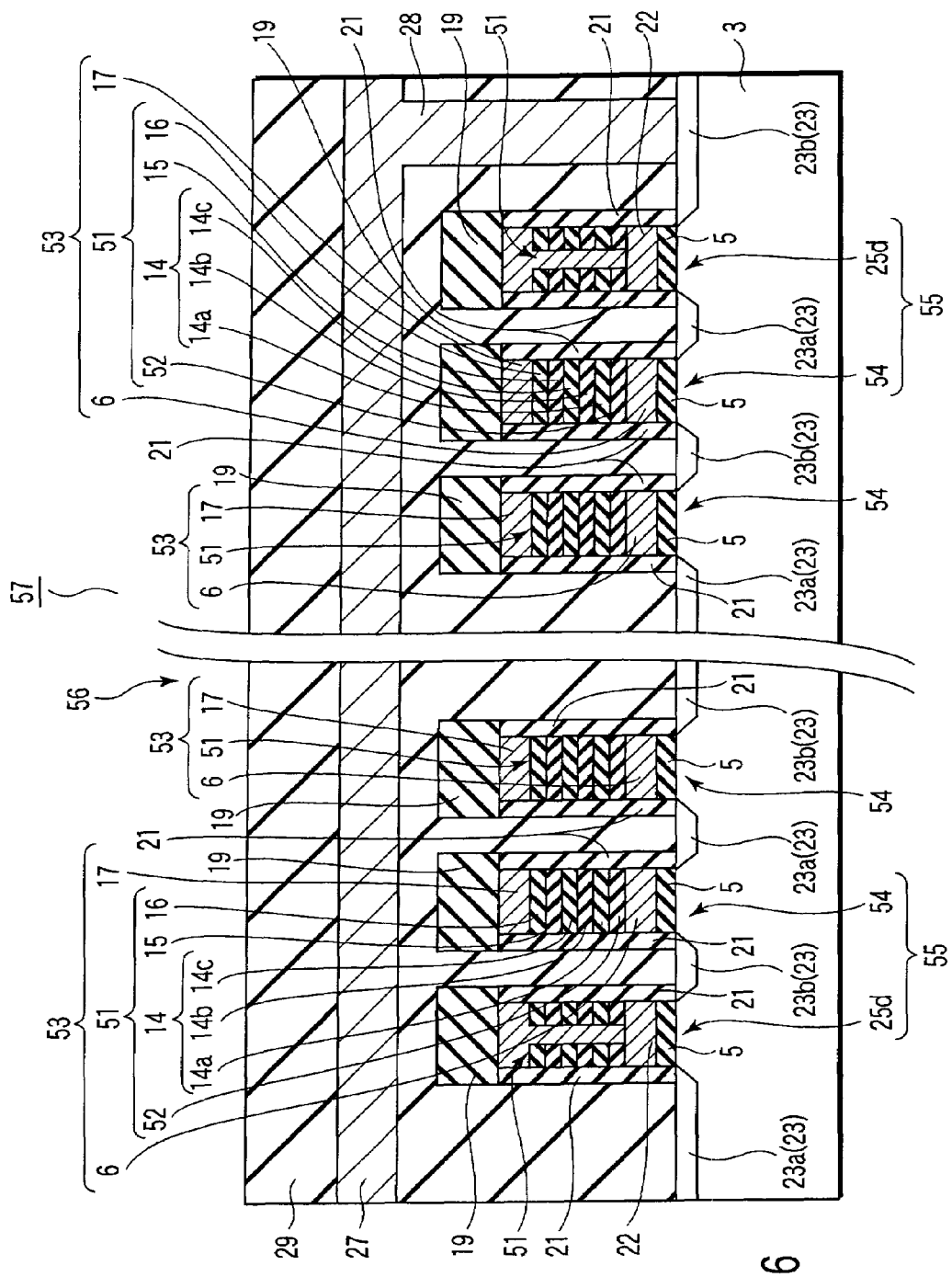
FIG. 16 is a sectional view illustrating the process of manufacturing the nonvolatile semiconductor memory device according to the fourth embodiment.

A fourth embodiment of the present invention will be described below with reference to FIGS. 15 to 19. FIGS. 15 and 16 are sectional views illustrating the steps of manufacturing the nonvolatile semiconductor memory device according to the fourth embodiment. The same portions as those in the first to third embodiments are denoted by the same reference numerals, and the detailed description thereof is omitted.

In the fourth embodiment, similarly to the inter-electrode insulating film 12 of the first embodiment, the inter-electrode insulating film has the NONONO film structure. The quality of the first SiN film directly in contact with the floating gate is improved, so that the formation of the bird's beak in the inter-electrode insulating film is further prevented in comparison with the inter-electrode insulating film 12 of the first embodiment, which results in an improvement in its electrical properties, its reliability, its performance and its quality, etc. The details are specifically described below.

As shown in FIG. 15A, the steps up to the step of forming the element separating structure and the line and space pattern of the charge accumulation layer 6 on the surface layer of the silicon substrate 3 are similar to the steps described in the first embodiment with reference to FIGS. 3A to 5B.

As shown in FIGS. 15A and 15B, an inter-electrode insulating film 51 having the NONONO film structure is provided on the silicon substrate 3 formed with the element separating structure and the line and space pattern of the charge accumulation layer 6. Specifically, the first SiN film as the second insulating film is provided on the surface layer of the polycrystal silicon film 6 by the step similar to the first embodiment. The first SiN film is impregnated with $1\times10^{17}$ atoms/cm³ or more of inactive gas. As the method of forming the first SiN adopted is a method of applying a nitriding treatment directly to the surface of the polycrystal silicon film 6 using nitrogen radical generated from a plasma of argon (Ar) and nitrogen (N). The Ar density in the SiN film can be adjusted suitably by changing a flow rate of Ar gas and nitrogen gas and a nitriding rate. In the fourth embodiment, about $3\times10^{18}$ atoms/cm³ or more of Ar gas is implanted into the first SiN film. As a result, a first SiN film 52 of the fourth embodiment is deposited on the surface of the polycrystal silicon film 6.

As shown in FIGS. 15A and 15B, in the step similar to the first embodiment, a 5-layer stacked insulating film is provided on the first SiN film 52. The 5-layer stacked insulating film includes the first $SiO_2$ film 14a, the second SiN film 14b and the second $SiO_2$ film 14c as the third insulating film 14, the third SiN film 15 as the fourth insulating film, and the third $SiO_2$ film 16 as the fifth insulating film. At the above steps, as shown in FIG. 17, the inter-electrode insulating film 51 having the N/ONO/N/O film structure is formed on the silicon substrate 3 so as to cover the surface of the floating gate 6 and the embedding insulating film 11. The inter-electrode insulating film 51 is composed of a six-layer stacked insulating film including the first SiN film 52 into which Ar is implanted, the first $SiO_2$ film 14a, the second SiN film 14b, the second $SiO_2$ film 14c, the third SiN film 15, and the third $SiO_2$ film 16. Similarly to the first embodiment, the third $SiO_2$ film 161s deposited so that its thickness is about 0.3 to 2.3 nm.

As shown in FIGS. 15A and 15B, in the steps similar to the first to third embodiments, an inter-polycapacitor 53 composed of the floating gate 6, the inter-electrode insulating film 51 and the control gate 17 is formed on the silicon substrate 3. As shown in FIG. 15B, the silicon oxide ($SiO_2$) film 21 as the post-oxide film is provided on the sidewalls of the control gates 17, the inter-electrode insulating films 51, the floating gates 6 and the tunnel gate insulating films 5.

As shown in FIG. 16, in the steps similar to the first to third embodiments, a plurality of memory transistors 54 are provided on the surface layer of the silicon substrate 3. The memory transistor 54 is composed of the tunnel gate insulating film 5, the floating gate 6, the inter-electrode insulating film 51, the control gate 17, the silicon nitride film 19, the silicon oxide film 21, the source area 23a and the drain area 23b. A plurality of selection transistors 25d are provided on the surface layer of the silicon substrate 3. The selection transistor 25d is composed of the tunnel gate insulating film 5, the selection gate 22, the inter-electrode insulating film 51, the silicon nitride film 19, the silicon oxide film 21, the source area 23a and the drain area 23b. These selection transistors 25d as well as the memory transistors 54 compose memory cells 55. The bit line 27 and the contact plug 28 are provided on the silicon substrate 3, thereby to form a memory cell array portion 56 of the NAND-type flash memory 57 in the fourth embodiment having the plurality of memory cells 55.

Hereinafter, concrete and detailed description with reference to the drawings is omitted, but a floating-gate rewritable nonvolatile semiconductor memory device (nonvolatile memory) 57 according to the fourth embodiment having the desired structures shown in FIGS. 15A and 16 is obtained by the predetermined post-process. That is, the NAND-type flash memory 57 having a plurality of memory transistors 54 is obtained. In the memory transistor 54, the inter-electrode insulating film 51 is formed into a NONONO film structure composed of a six-layer stacked insulating film in which the first $SiO_2$ film 52 into which Ar is implanted, the first $SiO_2$ film 14a, the second SiN film 14b, the second $SiO_2$ film 14c, the third SiN film 15, and the third $SiO_2$ film 16 are deposited in this order in the direction from the floating gate 6 to the control gate 17.

An experiment conducted on the inter-electrode insulating film 51 of the fourth embodiment by the inventors of the present invention will be described below with reference to FIGS. 17 to 19.

The inventors inspect a stress generated on the interface between the floating gate made of the polycrystal silicon film and the first SiN film formed by the general manufacturing method. As a comparative example, the first SiN film is formed by a publicly-known method with which heat treatment is conducted in an ammonia ($NH_3$) gas atmosphere. In general, it is known that normal SiN film and CVD-SiN formed by the heat treatment in the ammonia ($NH_3$) gas atmosphere have a very strong film stress. The interface characteristics between an inter-electrode insulating film and a gate deteriorate because of the strong film stress, causing the deterioration of the charge retention property of the inter-electrode insulating film. Particularly when a SiN film is formed by the heat treatment in the $NH_3$ gas atmosphere, the volume of the SiN film expands at the process of nitriding silicon (Si). At this time, the polycrystal silicon film to be the gate receives a strong stretching stress near the interface between the polycrystal silicon film and the SiN film. The SiN film receives a strong compressing stress near the interface between the SiN film and the polycrystal silicon film. As a result, the interface characteristics of the inter-electrode insulating film and the gate deteriorate significantly, and thus the charge retention property deteriorates significantly.

FIG. 17 is a graph illustrating results of evaluating the stress generated on the interface between the floating gate 6 as the polycrystal silicon film and the first SiN film 52 according to Raman measurement. This evaluation is conducted by producing the following sample. A silicon oxide film with thickness of about 8 nm is formed on a silicon substrate (not shown). A polycrystal silicon film with thickness of about 5 μm is formed on the surface of the silicon oxide film on the assumption of the floating gate 6. Then, a SiN film is formed on the surface of the polycrystal silicon film on the assumption of the first SiN film 52. The SiN film is formed by the heat treatment in the ammonia ($NH_3$) gas atmosphere. An abscissa axis of the graph in FIG. 17 shows a depth of the floating gate 6 when the interface between the polycrystal silicon film to be the floating gate 6 and the SiN film formed by the heat treatment in the ammonia gas atmosphere is 0. This portion is irradiated with a laser (not shown). The ordinate axis on the left side of the graph in FIG. 17 shows a shift amount Sp of a Raman peak. An ordinate axis on the right side of the graph in FIG. 17 shows a half width of the Raman peak. The shift amount Sp of the Raman peak is measured by using a value on a position at a depth of about 4.0 μm inside the floating gate 6 from the interface between the polycrystal silicon and the SiN film as a reference value N as shown by a circle of a broken line in FIG. 17.

According to the graph shown in FIG. 17, the shift amount Sp of the Raman peak of the stress generated on the interface between polycrystal silicon and SiN shifts to a minus side on positions closer to the interface between polycrystal silicon and SiN. The graph shown in FIG. 17 means that the vicinity of the interface receives the stress in comparison with the position at depth of about 4.0 μm inside the polycrystal silicon. The half width of the Raman peak increases on positions closer to the interface, and indicates disorder of molecular oscillation due to the stress.

This analyzing method is used to inspect the dependence property of a peak shift amount by means of the Raman measurement with respect to the Ar density in the SiN film. FIG. 18 is a graph illustrating the result. In FIG. 18, the SiN film is formed by a radical nitriding process using a plasma due to a mixed gas of Ar gas and nitrogen gas. A mixed gas ratio of the Ar gas to the nitrogen gas and a nitriding rate are changed, so that the Ar density in the SiN film is adjusted to a suitable level. According to the graph shown in FIG. 18, as the Ar density in the SiN film increases, the absolute value of the peak shift amount becomes smaller. That is, it is found that the interfacial stress of the SiN film and the polycrystal silicon is reduced. The graph shown in FIG. 18 shows that, in order to reduce the interfacial stress of the SiN film and the polycrystal silicon, the Ar density (inactive gas amount) in the SiN film should be set to not less than about $1 \times 10^{17}$ atoms/cm$^3$. In order to efficiently reduce the interfacial stress of the SiN film and the polycrystal silicon, namely, to nearly 0, it is desirable that the Ar density in the SiN film is set to not less than about $1 \times 10^{18}$ atoms/cm$^3$.

The result of inspecting an influence of the Ar density in the first SiN film 52 to be exerted on the electrical properties of the first SiN film 52 will be described below with reference to FIG. 19. FIG. 19 is a graph illustrating a dependence property of a shift amount ΔVge of a voltage value at the time of constant current TDDB measurement with respect to the Ar density in the first SiN film 52. The shift amount ΔVge of the voltage value is a voltage shift amount after about 2 C/cm$^2$ of charges are implanted into the inter-electrode insulating film 51, and becomes an index showing an electron trap amount near the interface between the first SiN film 52 and the floating gate 6. As is clear from FIG. 19, as the Ar density in the first SiN film 52 increases, the shift amount ΔVge of the voltage value becomes small, and the electron trap amount on the interface between the first SiN film 52 and the floating gate 6 is reduced. In order to reduce the electron trap amount on the interface between the first SiN film 52 and the floating gate 6, the Ar density (inactive gas amount) in the first SiN film 52 is desirably set to not less than about 1e17 atoms/cm$^3$. More desirably, the Ar density (inactive gas amount) in the first SiN film 52 is set to not less than about $1 \times 10^{18}$ atoms/cm$^3$.

It is considered that the result derived from the graph shown in FIG. 18 is correlated with the result derived from the graph shown in FIG. 19. That is, it is estimated that the interfacial stress of the floating gate 6 and the first SiN film 52 is reduced, so that the electron trap amount on the interface is reduced. In this application, the Ar density in the first SiN film 52 is set to about $3 \times 10^{18}$ atoms/cm$^3$ based on the new knowledge obtained in such a manner.

According to the fourth embodiment, the effect similar to that in the first to third embodiments is obtained. In order to prevent the formation of the bird's beak in the inter-electrode insulating film, it is simple and effective to form the SiN film on the interface between the inter-electrode insulating film and the floating gate and the interface between the inter-electrode insulating film and the control gate. However, with the normal technique for simply inserting the SiN film into the interface between the inter-electrode insulating film and the floating gate and the interface between the inter-electrode insulating film and the control gate, the electrical reliability such as the charge retention property of the inter-electrode insulating film and the inter-polycapacitor deteriorates because of its adverse effect.

Conversely, in the inter-electrode insulating film 51 of the fourth embodiment, Ar is mixed into the first SiN film 52 which directly contacts with the floating gate 6. As a result, the formation of the bird's beak in the inter-electrode insulating film 51 can be prevented, and its charge retention property, etc., can be improved. Also as to the inter-polycapacitor 53 in the fourth embodiment having the inter-electrode insulating film 51, its charge retention property, its device characteristics and its electrical reliability, etc., can be improved. Eventually also as to the NAND-type flash memory 57 having a plurality of inter-polycapacitors 53, its device characteristics, its electrical reliability, its performance and its quality, etc., can be improved.

Fifth Embodiment

Figure 21:
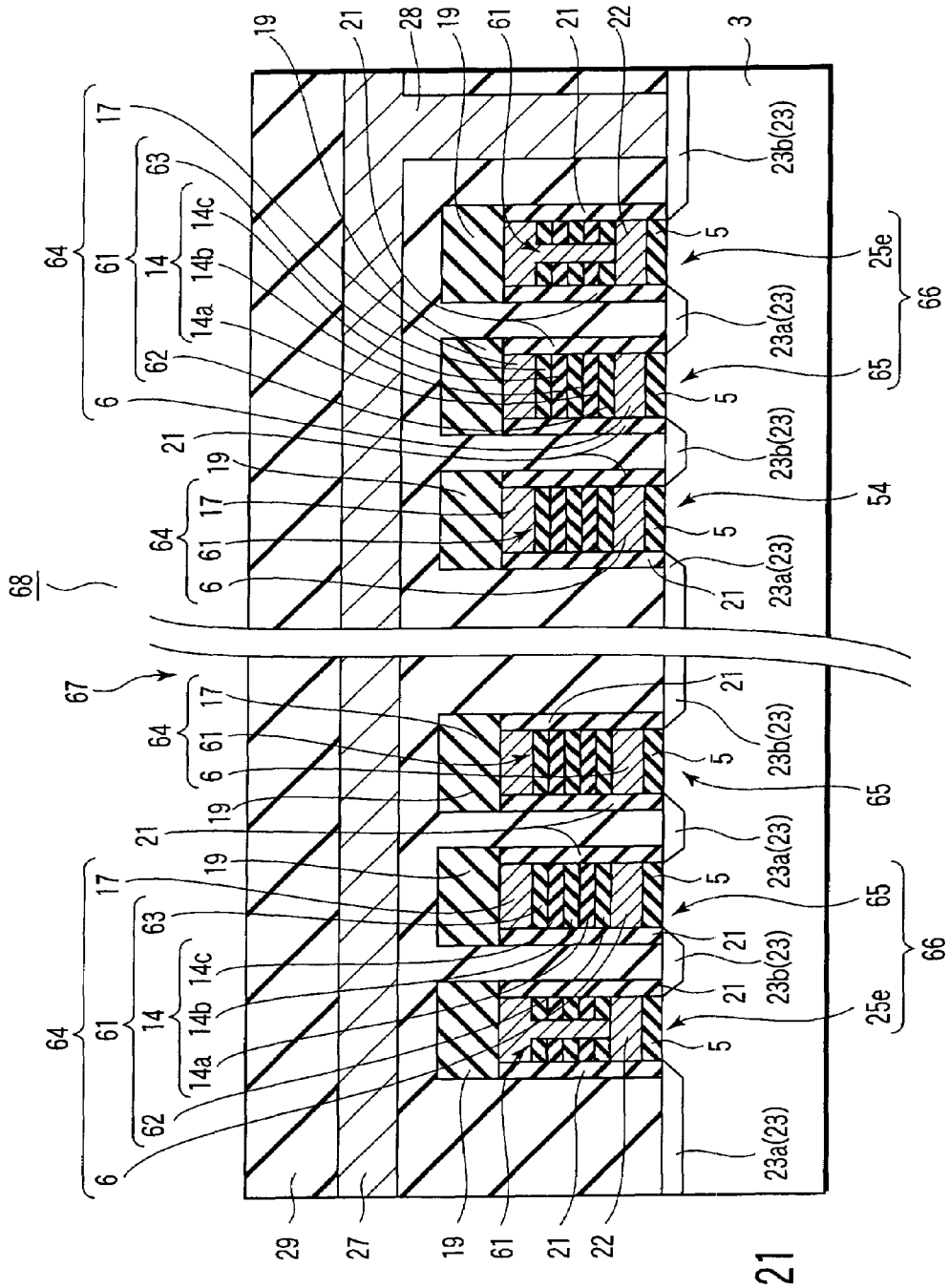
FIG. 21 is a sectional view illustrating the process of manufacturing the nonvolatile semiconductor memory device according to the fifth embodiment.

A fifth embodiment of the present invention will be described below with reference to FIGS. 20 and 21. FIGS. 20 and 21 are sectional views illustrating the steps of manufacturing the nonvolatile semiconductor memory device according to the fifth embodiment. The same portions as those in the first to fourth embodiments are denoted by the same reference numerals, and the detailed description thereof is omitted.

In the fifth embodiment, differently from the inter-electrode insulating films 12, 31, 41 and 51 of the first to fourth embodiments, the inter-electrode insulating film has a NONON film structure. Similarly to the inter-electrode insulating film 51 of the fourth embodiment, the quality of the first SiN film directly in contact with the floating gate is improved to thereby prevent the formation of the bird's beak in the inter-electrode insulating film. The quality of the third SiN film in contact with the control gate is improved, so that the formation of the bird's beak in the inter-electrode insulating film is prevented. As a result, the electrical properties, the reliability, the performance and the quality, etc., of the inter-electrode insulating film are improved. The details are specifically explained below.

As shown in FIG. 20A, the steps up to the step of forming the element separating structure and the line and space pattern of the charge accumulation layer 6 on the surface layer of the silicon substrate 3 are similar to those described in the first embodiment with reference to FIGS. 3A to 5B.

As shown in FIGS. 20A and 20B, an inter-electrode insulating film 61 having the NONON film structure is provided on the silicon substrate 3 formed with the element separating structure and the line and space pattern of the charge accumulation layer 6. Specifically, the first SiN film as the second insulating film is provided on the surface layer of the polycrystal silicon film 6 by the step similar to the first embodiment. Hydrogen (H$_2$) density in the first SiN film is adjusted to about $1 \times 10^{16}$ to $1 \times 10^{19}$ atoms/cm$^3$. As a result, a first SiN film 62 of the fifth embodiment is deposited on the surface of the polycrystal silicon film 6.

As shown in FIGS. 20A and 20B, in the step similar to the first embodiment, a four-layer stacked insulating film is provided on the first SiN film 62. The four-layer stacked insulating film includes the first SiO$_2$ film 14a, the second SiN film 14b and the second SiO$_2$ film 14c as the third insulating film 14, and the third SiN film 15 as the fourth insulating film. Similarly to the first SiN film 62, the hydrogen (H$_2$) density in the third SiN film is adjusted to about $1 \times 10^{16}$ to $1 \times 10^{19}$ atoms/cm$^3$. As a result, a third SiN film 63 of the fifth embodiment is deposited on the surface of the second SiO$_2$ film 14c. In the above steps, as shown in FIGS. 20A and 20B, an inter-electrode insulating film 61 having the N/ONO/N film structure is formed on the silicon substrate 3 so as to cover the surface of the floating gate 6 and the embedding insulating film 11. The inter-electrode insulating film 61 is composed of a five-layer stacked insulating film including the first SiN film 62 whose $H_2$ density is adjusted, the first $SiO_2$ film 14a, the second SiN film 14b, the second $SiO_2$ film 14c, and the third SiN film 63 whose $H_2$ density is adjusted.

As shown in FIGS. 20A and 20B, in the steps similar to the first to fourth embodiments, an inter-polycapacitor 64 composed of the floating gate 6, the inter-electrode insulating film 61 and the control gate 17 is formed on the silicon substrate 3. As shown in FIG. 20B, the silicon oxide ($SiO_2$) film 21 as the post-oxide film is provided on the sidewalls of the control gates 17, the inter-electrode insulating films 61, the floating gates 6 and the tunnel gate insulating films 5.

As shown in FIG. 21, in the steps similar to the first to fourth embodiments, a plurality of memory transistors 65 are provided on the surface layer of the silicon substrate 3. The memory transistor 65 is composed of the tunnel gate insulating film 5, the floating gate 6, the inter-electrode insulating film 61, the control gate 17, the silicon nitride film 19, the silicon oxide film 21, the source area 23a and the drain area 23b. A plurality of selection transistors 25e are provided on the surface layer of the silicon substrate 3. The selection transistor 25e is composed of the tunnel gate insulating film 5, the selection gate 22, the inter-electrode insulating film 61, the silicon nitride film 19, the silicon oxide film 21, the source area 23a and the drain area 23b. These selection transistors 25e as well as the memory transistors 65 compose memory cells 66. The bit line 27 and the contact plug 28 are provided on the silicon substrate 3, to thereby form a main portion of a memory cell array portion 67 of the NAND-type flash memory 68 in the fifth embodiment having the plurality of memory cells 66.

Hereinafter, concrete and detailed description with reference to the drawings is omitted, but a floating-gate rewritable nonvolatile semiconductor memory device (nonvolatile memory) 68 according to the fifth embodiment having the desired structures shown in FIGS. 20A and 21 is obtained by the predetermined post-process. That is, the NAND-type flash memory 68 having a plurality of memory transistors 65 is obtained. In the memory transistor 65, the inter-electrode insulating film 61 is formed into a NONON film structure composed of a five-layer stacked insulating film in which the first SiN film 62 whose $H_2$ density is adjusted, the first $SiO_2$ film 14a, the second SiN film 14b, the second $SiO_2$ film 14c, and the third SiN film 63 whose $H_2$ density is adjusted are disposed in this order in the direction from the floating gate 6 to the control gate 17.

According to an experiment conducted by the inventors of the present invention, when the $H_2$ density in the first SiN film 62 and the third SiN film 63 is controlled to suitable values in the inter-electrode insulating film 61 having the NONON film structure, similarly to the first SiN film 52 of the fourth embodiment into which Ar is implanted, the charge retaining properties of the first SiN film 62 and the third SiN film 63 can be improved.

The concrete and detailed description with reference to the drawings is omitted, but according to the experiment by the inventors, it is found that the hydrogen density in the SiN film has a suitable range. When the hydrogen density in the SiN film is too low, the shift amount $\Delta Vge$ of the voltage value at the time of the constant current TDDB measurement rises. When the hydrogen density in the SiN film is too high, an SILC property of the SiN film deteriorates. When hydrogen is present in the SiN film, dangling bond in the SiN film can be efficiently reduced. When the amount of the hydrogen in the SiN film is too small, however, the dangling bond in the SiN film cannot be efficiently ended, and a trap site remains in the SiN film. As a result, the value $\Delta Vge$ rises. That much hydrogen enters the SiN film means that many Si—H bonds are present. However, the Si—H bonds include Si—H bonds whose bonding force is weak. This results in deterioration of the SILC property of the SiN film into which much hydrogen is mixed.

The inventors of the present invention find out that the charge retention property and the electrical reliability of the first SiN film 62 and the third SiN film 63 can be improved by controlling the $H_2$ density in the first Sin film 62 and the third SiN film 63 to about $1\times10^{16}$ to $1\times10^{19}$ atoms/cm$^3$. That it, it is possible to obtain the inter-electrode insulating film 61 having the NONON film structure, in which the formation of the bird's beak is prevented and also the charge retention property and the electrical reliability are improved.

According to the fifth embodiment, the effect similar to that in the first to the fourth embodiments can be obtained. The inter-electrode insulating film 61 has the five-layer NONON film structure, so that the film 61 can be further thinned in comparison with the inter-electrode insulating films 12, 31, 41 and 51 having the six-layer or seven-layer structure in the first to fourth embodiments.

The nonvolatile semiconductor memory device of the present invention is not limited to the first to fifth embodiments. The structure and the manufacturing method can be partially and variously modified, or various setting are suitably combined without departing from the gist of the present invention.

For example, the first SiN film 13 in the first embodiment, the first SiN film 52 in the fourth embodiment and the first SiN film 62 in the fifth embodiment does not necessarily have to be provided on the entire surface of the silicon substrate 3. The first SiN films 13, 52 and 62 may be deposited only on the surface layer of the floating gate 6 by nitriding the surface layer of the floating gate 6 made of the polycrystal silicon film in a radical nitrogen atmosphere. As the inter-electrode insulating film on the first layer which directly contacts with the floating gate 6, the SiN film does not have to be necessarily provided. Instead of the SiN films 13, 52 and 62, a silicon oxynitride (SiON) film which contains not only silicon and nitrogen but also oxygen may be deposited as the inter-electrode insulating film on the first layer.

The first SiN films 13, 52 and 62, the second SiN films 14b and 33b, and the third SiN films 15 and 63 in the first to fifth embodiments may be replaced by a SiON film which further contains oxygen.

The third insulating film is not limited to the ONO films 14 and 33 in the first to fifth embodiments. That is, the third insulating film is not limited to the ONO films 14 and 33 or a stacked insulating film where a plurality of different types of insulating films such as the ONO films 14 and 33 are stacked. The third insulating film may be formed so as to have a single-layer structure or a stacked layer structure using a high-dielectric-constant film containing oxygen in a high-dielectric-constant (high-k) film. In this case, the third insulating film may contain at least one of nitrogen and silicon. The third insulating film may be formed by using a SiON film. That is, the third insulating film may be formed by using a single-layer high-dielectric-constant (high-k) oxide film, a high-k oxynitride film, SiON film or a stacked insulating film where they are stacked.

Specifically, a film which contains metal elements to be a main component of the high-dielectric-constant film such as hafnium (Hf), zirconium (Zr), tantalum (Ta), yttrium (Y), aluminum (Al) and lanthanum (La) is described as H for convenience. The film H may contain not only the metal elements and oxygen but also at least one of nitrogen and silicon. Similarly, a film containing oxygen and a film containing nitride are described as O and N, respectively, for convenience. When such a description method is used, the third insulating film may be composed of an OHO film where the film H is sandwiched between the films O in an up-down direction, an HNH film where the film N is sandwiched between the films H in an up-down direction, or an OH film or an HO film where the film H and the film O are stacked. The third insulating film may be formed by using an insulating film where the SiON film and the film H are stacked.

More specifically, like the inter-electrode insulating films 12 and 51 in the first and fourth embodiments, the first $SiO_2$ film 14a, the second SiN film 14b and the second $SiO_2$ film 14c in the NONONO structure may be replaced by a high-dielectric-constant film which contains oxygen and at least one of elements Hf, Zr, Ta, Y, Al, La and Si. The first $SiO_2$ film 14a, the second SiN film 14b and the second $SiO_2$ film 14c in the NONONO structure may be replaced by a stacked structure composed of a high-dielectric-constant thin film which contains oxygen and at least one of elements Hf, Zr, Ta, Y, Al, La and Si, and a thin film made of at least one of a $SiO_2$ film, a SiN film and a SiON film.

Similarly, like the inter-electrode insulating film 31 in the second embodiment and the inter-electrode insulating film 41 in the third embodiment, the second $SiO_2$ film 33a, the second SiN film 33b and the third $SiO_2$ film 33c in the ONONON structure and the ONONONO structure may be replaced by a high-dielectric-constant film which contains oxygen and at least one of elements Hf, Zr, Ta, Y, Al, La and Si. The second $SiO_2$ film 33a, the second SiN film 33b and the third $SiO_2$ film 33c in the ONONON structure and the ONONONO structure may be replaced by a stacked structure composed of a high-dielectric-constant thin film which contains oxygen and at least one of elements Hf, Zr, Ta, Y, Al, La and Si and a thin film made of at least one of a $SiO_2$ film, a SiN film and a SiON film.

That is, the third insulating films 14 and 33 may be composed of at least one of a $SiO_2$ film, a SiN film, a metal oxide thin film such as a high-dielectric-constant metal oxide thin film, and a metal oxynitride thin film such as a high-dielectric-constant metal oxynitride thin film. The metal oxide thin film and the metal oxynitride thin film may contain oxygen and at least one of metal elements Hf, Zr, Ta, Y, Al, La and Si.

The third insulating films 14 and 33 do not necessarily have to be composed of the $SiO_2$ films 14a, 14c, 33a and 33c, and the SiN films 14b and 33b. For example, instead of the $SiO_2$ films 14a, 14c, 33a and 33c, an HTO film may be used. Instead of the SiN films 14b and 33b, a film which is formed by the thermal CVD method by using DCS ($SiH_2Cl_2$) or HCD ($Si_2Cl_6$) and $NH_3$ gas are used as raw materials. Instead of the SiN films 14b and 33b, a SiON film in which oxygen is added to a SiN film may be used.

The third SiN film 15 in the first to fourth embodiments and the third SiN film 63 in the fifth embodiment do not have to be necessarily provided by the CVD method. The third SNi films 15 and 63 may be provided by nitriding the pole surfaces of the second $SiO_2$ films 14c and 33c in a radical nitrogen atmosphere. Instead of the third SiN films 15 and 63, a SiON film in which the SiN film further contains oxygen may be used. The first SiN film 13 in the second embodiment does not have to be necessarily provided by the CVD method. The first SiN film 13 in the second embodiment may be provided by nitriding the pole surface of the first $SiO_2$ film 32 in a radical nitrogen atmosphere.

The third $SiO_2$ film 16 in the first and fourth embodiments and the third $SiO_2$ film 33c in the second and third embodiments do not have to be necessarily provided by the CVD method. The third $SiO_2$ films 16 and 33c may be deposited by forming the third SiN film 15 and the second SiN film 33b and giving a surface treatment to the surfaces of the SiN films 15 and 33b by using a solution to which hydrogen peroxide ($H_2O_2$) is added or a solution to which ozone ($O_3$) is added.

In the fourth embodiment, Ar is mixed into the first SiN film 52, but an element to be mixed is not limited to this. The element to be mixed into the first SiN film 52 may be an element belonging to inactive gas (noble gas). That is, the element to be mixed into the first SiN film 52 may be at least one of helium (He), neon (Ne), argon (Ar), krypton (Kr) and xenon (Xe).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a nonvolatile semiconductor memory device comprising:
    providing a first insulating film on a surface of a semiconductor substrate;
    providing a silicon film to be a charge accumulation layer on the first insulating film;
    providing a fifth insulating film containing silicon and oxygen on the silicon film by performing a surface treatment using a solution having hydrogen peroxide added therein or a solution having ozone added therein to the silicon film;
    providing a second insulating film containing silicon and nitrogen on the fifth insulating film;
    providing a third insulating film on the second insulating film, the third insulating film is composed of a single-layer insulating film containing oxygen or multiple-layer stacked insulating film at least whose films on a top layer and a bottom layer contain oxygen, and relative dielectric constant of the single-layer insulating film and the stacked insulating film being larger than relative dielectric constant of a silicon oxide film;
    providing a fourth insulating film containing silicon and nitrogen on the third insulating film; and
    providing a control gate above the fourth insulating film.

2. The method according to claim 1, wherein
    the fifth insulating film is formed so as to have a thickness of 0.3 to 2.3 nm.

3. The method according to claim 1, wherein
    performing a dilute hydrofluoric acid process to a surface of the silicon film in advance of performing the surface treatment for providing the fifth insulating film.

4. The method according to claim 1, wherein
    providing each the second, third, and fourth insulating films by an LP-CVD method or an ALD-CVD method.

5. The method according to claim 4, wherein
    providing the fifth insulating film by an LP-CVD method or an ALD-CVD method.

6. The method according to claim 1, further comprising:
    providing another fifth insulating film contains silicon and oxygen between the fourth insulating film and the control gate by performing a surface treatment using a solution having hydrogen peroxide added therein or a solution having ozone added therein to the fourth insulating film.

7. The method according to claim 6, wherein the another fifth insulating film is formed so as to have a thickness of 0.3 to 2.3 nm.

8. The method according to claim 1, wherein the third insulating film has relative dielectric constant which is larger than 3.9.

9. The method according to claim 1, wherein the third insulating film has a three-layer structure where an insulating film as an intermediate layer containing silicon and nitrogen is put between upper and lower two insulating films containing silicon and oxygen.

10. The method according to claim 1, wherein the third insulating film has a stacked structure whose relative dielectric constant is higher than the silicon oxide film is put between two insulating films containing oxygen, or a single-layer structure or a stacked structure which has an insulating film containing oxygen and at least one element selected from hafnium (HO, zirconium (Zr), tantalum (Ta), yttrium (Y), aluminum (Al), and lanthanum (La).

11. A manufacturing method of a nonvolatile semiconductor memory device comprising:
providing a first insulating film on a surface of a semiconductor substrate;
providing a silicon film to be a charge accumulation layer on the first insulating film;
providing a second insulating film containing silicon and nitrogen on the silicon film by applying a nitriding treatment directly to a surface of the silicon film using nitrogen radical generated from a plasma of inactive gas and nitrogen;
providing a third insulating film on the second insulating film, the third insulating film is composed of a single-layer insulating film containing oxygen or multiple-layer stacked insulating film at least whose films on a top layer and a bottom layer contain oxygen, and relative dielectric constant of the single-layer insulating film and the stacked insulating film being larger than relative dielectric constant of a silicon oxide film;
providing a fourth insulating film containing silicon and nitrogen on the third insulating film; and
providing a fifth insulating film containing silicon and oxygen on the fourth insulating film; and
providing a control gate on the fifth insulating film.

12. The method according to claim 11, wherein the second insulating film contains an element of the inactive gas not less than $1 \times 10^{17}$ atoms/cm$^3$.

13. The method according to claim 11, wherein an element of the inactive gas is argon (Ar).

14. The method according to claim 11, wherein the third insulating film has relative dielectric constant which is larger than 3.9.

15. The method according to claim 11, wherein the third insulating film has a three-layer structure where an insulating film as an intermediate layer containing silicon and nitrogen is put between upper and lower two insulating films containing silicon and oxygen.

16. The method according to claim 11, wherein the fifth insulating film is formed so as to have a thickness of 0.3 to 2.3 nm.

* * * * *

UNITED STATES PATENT AND TRADEMARK OFFICE
CERTIFICATE OF CORRECTION

| | | |
|---|---|---|
| PATENT NO. | : 7,651,914 B2 | Page 1 of 1 |
| APPLICATION NO. | : 12/176559 | |
| DATED | : January 26, 2010 | |
| INVENTOR(S) | : Akahori et al. | |

It is certified that error appears in the above-identified patent and that said Letters Patent is hereby corrected as shown below:

Claim 10, column 27, line 22, change "halfnium (HO," to --hafnium (Hf),--.

Signed and Sealed this

Twentieth Day of April, 2010

David J. Kappos
*Director of the United States Patent and Trademark Office*